United States Patent
Lee et al.

(10) Patent No.: US 10,750,613 B2
(45) Date of Patent: Aug. 18, 2020

(54) TRANSPARENT ELECTRODE AND METHOD FOR MANUFACTURING SAME

(71) Applicant: RESEARCH & BUSINESS FOUNDATION SUNGKYUNKWAN UNIVERSITY, Suwon-si (KR)

(72) Inventors: Hyoyoung Lee, Suwon-si (KR); Hanleem Lee, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 458 days.

(21) Appl. No.: 14/773,139

(22) PCT Filed: Feb. 28, 2014

(86) PCT No.: PCT/KR2014/001699
§ 371 (c)(1),
(2) Date: Dec. 7, 2015

(87) PCT Pub. No.: WO2014/137111
PCT Pub. Date: Sep. 12, 2014

(65) Prior Publication Data
US 2016/0095212 A1    Mar. 31, 2016

(30) Foreign Application Priority Data

Mar. 6, 2013  (KR) .......................... 10-2013-0024148

(51) Int. Cl.
*H05K 1/03* (2006.01)
*H01L 31/0224* (2006.01)
(Continued)

(52) U.S. Cl.
CPC .................. *H05K 1/03* (2013.01); *H01B 1/08* (2013.01); *H01L 21/26506* (2013.01);
(Continued)

(58) Field of Classification Search
None
See application file for complete search history.

(56) References Cited

U.S. PATENT DOCUMENTS

| 2004/0203256 A1 | 10/2004 | Yang et al. | |
| 2007/0278448 A1* | 12/2007 | Chari | B82Y 20/00 |
| | | | 252/299.01 |

(Continued)

FOREIGN PATENT DOCUMENTS

| KR | 10-2011-0073296 A | 6/2011 |
| KR | 10-2012-0125906 A | 11/2012 |

(Continued)

OTHER PUBLICATIONS

Sugimura et al., Molecular packing density of a self-assembled monolayer formed from N-(2-aminoethyl)-3-aminopropyltriethoxysilane by a vapor phase process, Chem. Commun., 2011, 47, 8841-8843.*

(Continued)

*Primary Examiner* — Coris Fung
(74) *Attorney, Agent, or Firm* — NSIP Law

(57) ABSTRACT

The present application relates to a transparent electrode and a method for manufacturing the same. The transparent electrode includes a transparent substrate, a self-assembled monolayer on the transparent substrate, and a metal nanowire layer on the self-assembled monolayer. The method includes forming a self-assembled monolayer including a polar functional group on a transparent substrate and forming a metal nanowire layer on the self-assembled monolayer.

13 Claims, 15 Drawing Sheets

(51) Int. Cl.
  *H01B 1/08*     (2006.01)
  *H01L 21/265*   (2006.01)
  *H05K 3/12*     (2006.01)
  *H05K 3/38*     (2006.01)
  *H05K 1/02*     (2006.01)
  *H05K 1/09*     (2006.01)
  *H01L 51/44*    (2006.01)
  *H05K 3/28*     (2006.01)
  *H05K 3/22*     (2006.01)

(52) U.S. Cl.
  CPC ..... *H01L 31/022466* (2013.01); *H05K 1/028* (2013.01); *H05K 1/0274* (2013.01); *H05K 1/09* (2013.01); *H05K 3/1208* (2013.01); *H05K 3/386* (2013.01); *H01L 51/442* (2013.01); *H05K 1/0283* (2013.01); *H05K 1/0393* (2013.01); *H05K 1/097* (2013.01); *H05K 3/22* (2013.01); *H05K 3/28* (2013.01); *H05K 3/285* (2013.01); *H05K 2201/0108* (2013.01); *H05K 2203/095* (2013.01); *H05K 2203/1173* (2013.01)

(56) References Cited

U.S. PATENT DOCUMENTS

| | | | | |
|---|---|---|---|---|
| 2009/0052029 | A1* | 2/2009 | Dai | B82Y 20/00 |
| | | | | 359/485.02 |
| 2010/0065818 | A1* | 3/2010 | Kim | B82Y 10/00 |
| | | | | 257/14 |
| 2013/0022752 | A1* | 1/2013 | Antonakas | C23C 16/0245 |
| | | | | 427/444 |
| 2013/0299217 | A1* | 11/2013 | Yuen | H05K 1/097 |
| | | | | 174/257 |
| 2013/0329366 | A1* | 12/2013 | Wang | H05K 7/20963 |
| | | | | 361/704 |
| 2014/0377670 | A1* | 12/2014 | Khiterer | H01M 12/08 |
| | | | | 429/405 |

FOREIGN PATENT DOCUMENTS

| | | |
|---|---|---|
| KR | 10-2013-0000786 A | 1/2013 |
| KR | 10-2013-0006868 A | 1/2013 |
| KR | 10-1236138 B1 | 2/2013 |

OTHER PUBLICATIONS

Kundu et al., "Optical Properties of Zno Nanoparticles Prepared by Chemical Method Using Poly(VinylAlcohol ) (PVA) as Capping Agent", International Journal of Soft Computing and Engineering (IJSCE), ISSN: 2231-2307, vol. 1, Issue-NCRAMT2011, Jul. 2011. (Year: 2011).*

Gupta et al., Hybrid nanocomposite films of polyvinyl alcohol and ZnO as interactive gas barrier layers for electronics device passivation, : 10.1039/C2RA21714G (Paper) RSC Adv., Oct 2012, 2, 11536-11543. (Year: 2012).*

Moon, In Kyu, et al. "2D graphene oxide nanosheets as an adhesive over-coating layer for flexible transparent conductive electrodes." Scientific reports 3 (2013).

International Search Report dated Jun. 5, 2014 in International Application No. PCT/KR2017/001699 (4 Pages, in Korean, with English language translation).

* cited by examiner a.

b.

a. Without Silanization b. S(NH$_2$)/NW/GO c. S(NNH$_2$)/NW d. S(NNH$_2$)/NW/GO

TRANSPARENT ELECTRODE AND METHOD FOR MANUFACTURING SAME

CROSS-REFERENCE TO RELATED APPLICATIONS

This application is a U.S. National Stage Application of International Application No. PCT/KR2014/001699 filed on Feb. 28, 2014, which claims the benefit under 35 USC 119(a) and 365(b) of Korean Patent Application No. 10-2013-0024148 filed on Mar. 6, 2013, in the Korean Intellectual Property Office, the entire disclosures of which are incorporated herein by reference for all purposes.

TECHNICAL FIELD

The invention relates to a transparent electrode and a method for manufacturing the same.

BACKGROUND

In recent years, rapid development of the nanotechnology, information technology and display technology has led to the ubiquitous age where people have access to information at anytime and anywhere. Accordingly, a need for mobile information electronic devices easy to carry with mobility has been increased. A need for flexible information electronic devices, which are freely deformed, flexible, lightweight, and easy to carry, as information devices for realizing the ubiquitous age has grown.

Most of the flexible information electronic devices represented by a flexible display, a flexible transistor, a flexible touch panel, and a flexible solar cell use a flexible transparent electrode as an electrode to control a current or light.

The flexible transparent electrode is an electrode formed on a flexible substrate, and has a high conductivity, a high transmittance in a visible region, and a high flexibility, and, thus, it can be applied to an electrode of a flexible information electronic device.

At present, ITO (indium tin oxide) has been mainly used as a transparent electrode. However, the ITO is expensive and fragile. Therefore, there is a limit to application of the ITO to flexible devices.

At present, various transparent conductive materials, such as graphene, carbon nanotube, and metal nanomaterial, are known as a material applicable to the flexible transparent electrode. By way of example, Korean Patent Publication No. 2013-0006868 describes a graphene substrate, and a transparent electrode and a transistor comprising the same.

However, polymer materials, such as PDMS (polydimethylsiloxane), PET (polyethylene terephthalate), and PAN (polyacrylonitrile), applicable to a substrate of the flexible transparent electrode have a strong hydrophobicity on their surfaces. Therefore, the transparent conductive material, which mainly has hydrophilicity, is not readily attached to the substrate. Accordingly, even if the substrate has flexibility, the transparent conductive material formed on the substrate is not stably attached to the substrate but easily separated therefrom. Thus, it has been difficult to achieve extensive commercialization of the flexible transparent electrode. In order to solve such a problem, plasma, a chemical vapor deposition method, LBL (layer by layer), and a surfactant have been used. However, these means may deteriorate elasticity of the substrate or cannot sustain their effects, and, thus, cannot fundamentally solve the problem.

The present disclosure can provide a transparent electrode and a method for manufacturing the transparent electrode in which a self-assembled monolayer is formed on a transparent substrate to enhance hydrophilicity of the transparent substrate, a metal nanowire layer is formed on the transparent substrate by using the hydrophilicity to have electrical conductivity, and a graphene oxide layer is formed on the metal nanowire layer to stabilize the metal nanowire layer.

However, problems to be solved by the present disclosure are not limited to the above-described problems. Although not described herein, other problems to be solved by the present disclosure can be clearly understood by those skilled in the art from the following descriptions.

DETAILED DESCRIPTION OF THE INVENTION

Problems to be Solved by the Invention

The present disclosure can provide a transparent electrode and a method for manufacturing the transparent electrode in which a self-assembled monolayer is formed on a transparent substrate to enhance hydrophilicity of the transparent substrate, a metal nanowire layer is formed on the transparent substrate by using the hydrophilicity to have electrical conductivity, and a graphene oxide layer is formed on the metal nanowire layer to stabilize the metal nanowire layer.

However, problems to be solved by the present disclosure are not limited to the above-described problems. Although not described herein, other problems to be solved by the present disclosure can be clearly understood by those skilled in the art from the following descriptions.

Means for Solving the Problems

In a first aspect of the present disclosure, there is provided a transparent electrode including: a transparent substrate; a self-assembled monolayer formed on the transparent substrate; and a metal nanowire layer formed on the self-assembled monolayer.

In a second aspect of the present disclosure, there is provided a method for manufacturing a transparent electrode, including: forming a self-assembled monolayer including a polar functional group on a transparent substrate; and forming a metal nanowire layer on the self-assembled monolayer.

Effect of the Invention

In a transparent electrode of the present disclosure, a self-assembled monolayer is formed on a transparent substrate and a hydrophilic metal nanowire can be readily attached to the hydrophobic transparent substrate due to a polar functional group included in the self-assembled monolayer. Further, a graphene oxide layer can be formed on the metal nanowire due to the polar functional group included in the self-assembled monolayer. Thus, even if the transparent substrate is elongated or bent, the stability of a network in the metal nanowire can be further maintained.

BEST MODE FOR CARRYING OUT THE INVENTION

Figure 1:
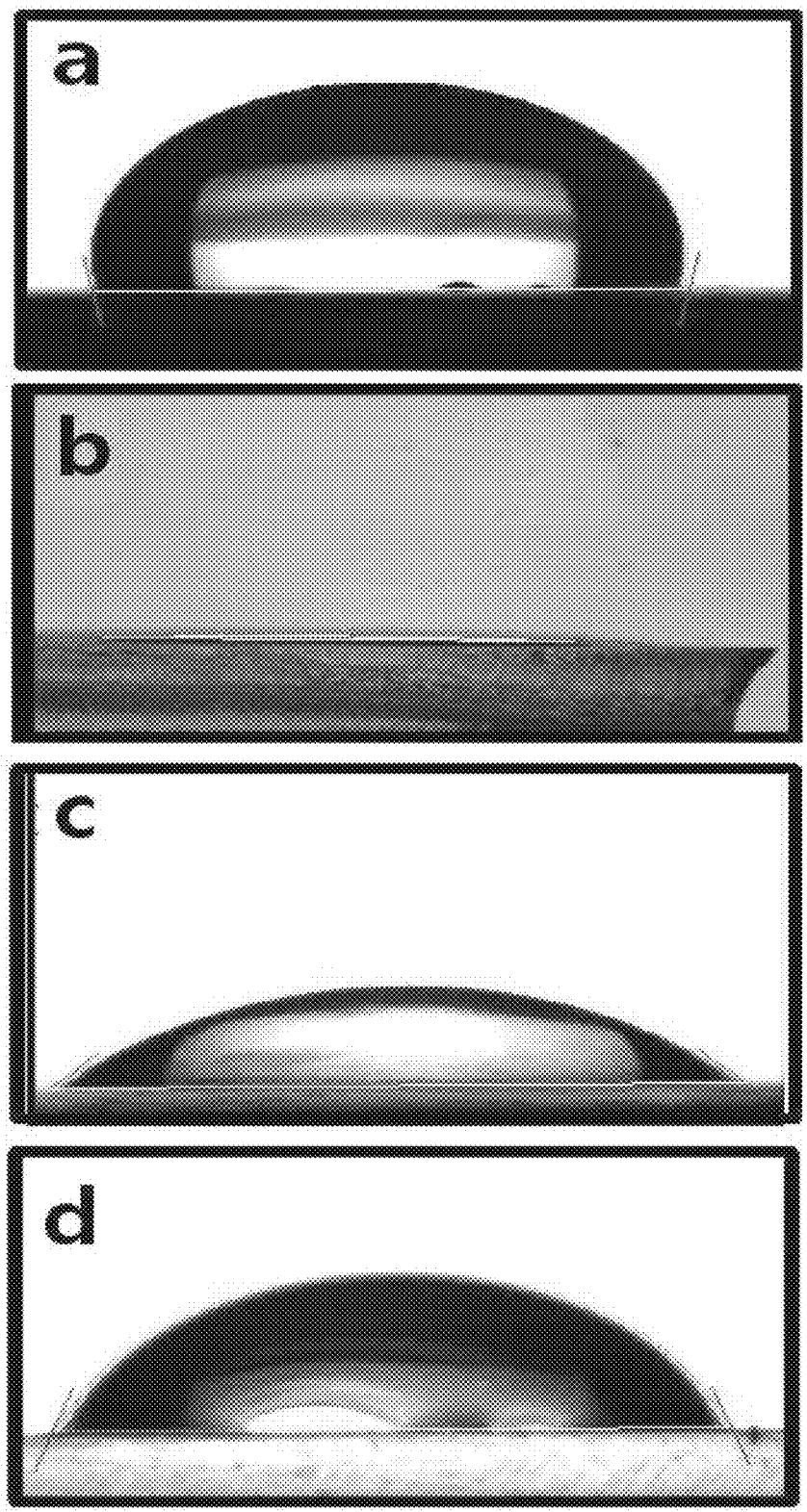
FIG. 1 provides optical images with which water contact angles of a transparent electrode are measured according to an Example of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the another element and a case that any other element exists between these two elements.

Further, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereinafter, embodiments and Examples of the present disclosure will be described in detail with reference to the accompanying drawings, but the present disclosure may not be limited thereto.

In a first aspect of the present disclosure, there is provided a transparent electrode including: a transparent substrate; a self-assembled monolayer formed on the transparent substrate; and a metal nanowire layer formed on the self-assembled monolayer.

According to an embodiment of the present disclosure, a surface of the transparent substrate may have hydrophobicity, but may not be limited thereto.

By way of example, the surface of the transparent substrate has hydrophobicity and thus is not readily bonded to a hydrophilic metal nanowire due to a weak affinity with the hydrophilic metal nanowire. However, if the self-assembled monolayer is formed on the transparent substrate, the metal nanowire is bonded to the self-assembled monolayer due to a polarity (i.e., hydrophilicity) of the self-assembled monolayer and thus can be readily deposited and attached onto the transparent substrate, but may not be limited thereto.

By way of example, the bonding between the metal nanowire and the self-assembled monolayer may be formed by an electrostatic interaction, but may not be limited thereto.

According to an embodiment of the present disclosure, the transparent electrode may further include a graphene oxide layer formed on the metal nanowire layer, but may not be limited thereto.

By way of example, the graphene oxide layer may be bonded to the self-assembled monolayer, or may be bonded to the metal nanowire layer, or may be bonded to all of the self-assembled monolayer and the metal nanowire layer, but may not be limited thereto.

According to an embodiment of the present disclosure, the graphene oxide layer may be bonded to the self-assembled monolayer by one selected from the group consisting of an electrostatic interaction, an amide bonding, an ester bonding, a thioester bonding, and combinations thereof, but may not be limited thereto. By way of example, the amide bonding may be formed between carboxyl group (—COOH) included in the graphene oxide and an amine group (—NH$_2$) included in the self-assembled monolayer, but may not be limited thereto.

According to an embodiment of the present disclosure, the graphene oxide layer may be bonded to the metal nanowire layer by an electrostatic interaction, but may not be limited thereto.

By way of example, a diameter of the metal nanowire may be in the range of from about 1 nm to about 100 nm, but may not be limited thereto. By way of example, the diameter of the metal nanowire may be in the range of from about 1 nm to about 100 nm, from about 5 nm to about 100 nm, from about 10 nm to about 100 nm, from about 30 nm to about 100 nm, from about 50 nm to about 100 nm, from about 70 nm to about 100 nm, from about 90 nm to about 100 nm, from about 1 nm to about 90 nm, from about 1 nm to about 70 nm, from about 1 nm to about 50 nm, from about 1 nm to about 30 nm, or from about 1 nm to about 10 nm, but may not be limited thereto.

According to an embodiment of the present disclosure, the self-assembled monolayer may include an organic compound represented by the following Chemical Formula 1, but may not be limited thereto:

X-A-Y.     [Chemical Formula 1]

Herein, in the formula, X includes a member selected from the group consisting of silane group, alkylamine group, and phosphonate group, Y includes a polar functional group selected from the group consisting of an amine group, an amide group, pyrrole group, hydroxyl group, thiol group, an epoxide group, and a halide group, and A as a carbon molecular axis includes a member selected from the group consisting of oxygen, nitrogen, phosphorus, sulfur, silicon, or germanium atom; a unsaturated hydrocarbon group including C≡C, C=C, C≡C—C≡C, C≡C—C=C, or C=C—C=C; N=N, —NH—CO— or a benzene ring-containing functional group; and combinations thereof.

By way of example, the silane group may be represented by the following Chemical Formula 2, but may not be limited thereto:

[Chemical Formula 2]

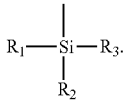

Herein, each of the $R_1$ to $R_3$ is independently hydrogen, a halogen element, an alkyl group, an alkoxy group, an aralkyl, or an aryl group, and may include one or more oxygen, nitrogen, sulfur, or metal atoms, but may not be limited thereto.

By way of example, the alkylamine group may be represented by —$R_4$—$NH_2$; the phosphonate group may be represented by —$PO_3H_2$; the amine group may be represented by —$NH_2$, —$N(R_5)H$, $N(R_6)_2$, or $N(R_7)$—$NH_2$; the amide group may be represented by —$C(O)NH_2$; the pyrrole group may be represented by —$C_4H_4NH$; and the halide group may include —F, —Cl, —Br, or —I, but may not be limited thereto.

By way of example, each of the $R_4$ to $R_7$ is independently hydrogen, a halogen element, an alkyl group, an alkoxy group, an aralkyl, or an aryl group, and may include one or more oxygen, nitrogen, sulfur, or metal atoms, but may not be limited thereto.

By way of example, each of the alkyl group or the alkoxy group may independently include a linear or branched hydrocarbon group having 1 to about 22 carbon atoms, or 1 to about 20 carbon atoms, or 1 to about 12 carbon atoms, or 1 to about 10 carbon atoms, or 1 to about 6 carbon atoms, but may not be limited thereto. The alkyl group may include the hydrocarbon group which loses one or more hydrogen atoms and has one or more bond lines, but may not be limited thereto. By way of example, the alkyl group may be methyl, ethyl, propyl, isopropyl, n-butyl, t-butyl, isobutyl, pentyl, hexyl, isohexyl, heptyl, 4,4-dimethylpentyl, octyl, 2,2,4-trimethylpentyl, nonyl, decyl, undecyl, dodecyl, and isomers thereof, and the alkoxy group may be an alkoxy group including the above-exemplified alkyl group, but may not be limited thereto. The alkyl group and the alkoxy group may be substituted by a halogen element, an alkyl group, an alkoxy group, an aralkyl, or an aryl group, but may not be limited thereto.

By way of example, the aralkyl may include an aromatic ring bonded via the alkyl group as described above, i.e., an aryl-substituted alkyl group. As a non-limiting example, the aralkyl may be an arylalkyl group in which an aryl group is attached to a linear or branched alkyl group having 1 to about 22 carbon atoms, or 1 to about 20 carbon atoms, or 1 to about 10 carbon atoms, or 1 to about 6 carbon atoms, but may not be limited thereto. Examples of the aralkyl may include benzyl, phenylethyl, phenylpropyl, phenylbutyl, phenylpentyl, phenylhexyl, biphenylmethyl, biphenylethyl, biphenylpropyl, biphenylbutyl, biphenylpentyl, biphenylhexyl, naphthyl, and the like, but may not be limited thereto.

By way of example, the aryl group may include a monocyclic or bicyclic aromatic ring, such as, phenyl and substituted phenyl, and a conjugated group, such as naphthyl, phenanthrenyl, indenyl, tetrahydronaphthyl, and indanyl, but may not be limited thereto. Therefore, the aryl group may include one or more rings having 6 or more atoms and may include 5 or less rings having 22 or less atoms, and double bonds may exist alternately (resonantly) between adjacent carbon atoms or appropriate hetero atoms, but may not be limited thereto. The aryl group may be optionally substituted by one or more groups including a halogen (for example, F, Br, Cl, or I), an alkyl (for example, methyl, ethyl, propyl), alkoxy (for example, methoxy or ethoxy), hydroxyl, carboxyl, carbamoyl, an alkyloxy carbonyl, nitro, an alkenyloxy, trifluoromethyl, an amino, cycloalkyl, an aryl, a heteroaryl, cyano, $S(O)_m$ (m=0, 1, 2), or thiol, but may not be limited thereto.

By way of example, the self-assembled monolayer may include a member selected from the group consisting of [3-(2-aminoethylamino)propyl]trimethoxysilane, 3-glycidyloxypropyltrimethoxysilane, 3-chloropropyltriethoxysilane, mercaptopropyltrimethoxysilane (MPTMS), N-(2-aminoethyl)-3-aminopropyltrimethoxysilane, (3-aminopropyl)trimethoxysilane, 3-trimethoxysilylpropyl)diethylenetriamine, (3-aminopropyl)triethoxysilane, N-(trimethoxysilylpropyl)ethylenediamine triacetic acid, hexadecanethiol (HDT), epoxyhexyltriethoxysilan, ethylenediamine, and combinations thereof, but may not be limited thereto.

According to an embodiment of the present disclosure, a thickness of the self-assembled monolayer may be in the range of from about 1 nm to about 100 nm, but may not be limited thereto. By way of example, the thickness of the self-assembled monolayer may be in the range of from about 1 nm to about 100 nm, from about 5 nm to about 100 nm, from about 10 nm to about 100 nm, from about 30 nm to about 100 nm, from about 50 nm to about 100 nm, from about 70 nm to about 100 nm, from about 90 nm to about 100 nm, from about 1 nm to about 90 nm, from about 1 nm to about 70 nm, from about 1 nm to about 50 nm, from about 1 nm to about 30 nm, or from about 1 nm to about 10 nm, but may not be limited thereto.

According to an embodiment of the present disclosure, the metal nanowire layer may include a metal-nanowire or alloy-nanowire including a member selected from the group consisting of Ni, Co, Fe, Pt, Au, Ag, Al, Cr, Cu, Mg, Mn, Mo, Rh, Si, Ta, Ti, W, U, V, Zr, Ge, and combinations thereof, but may not be limited thereto.

According to an embodiment of the present disclosure, a thickness of the metal nanowire layer may be in the range of from about 10 nm to about 1000 nm, but may not be limited thereto. By way of example, the thickness of the metal nanowire layer may be in the range of from about 10 nm to about 1000 nm, from about 100 nm to about 1000 nm, from about 300 nm to about 1000 nm, from about 500 nm to about 1000 nm, from about 700 nm to about 1000 nm, from about 900 nm to about 1000 nm, from about 10 nm to about 900 nm, from about 10 nm to about 700 nm, from about 10 nm to about 500 nm, from about 10 nm to about 300 nm, from about 10 nm to about 100 nm, from about 20 nm to about 100 nm, from about 30 nm to about 100 nm, from about 50 nm to about 100 nm, from about 70 nm to about 100 nm, from about 90 nm to about 100 nm, from about 10 nm to about 90 nm, from about 10 nm to about 70 nm, from about 10 nm to about 50 nm, from about 10 nm to about 30 nm, from about 10 nm to about 20 nm, from about 100 nm to about 300 nm, from about 100 nm to about 500 nm, from about 100 nm to about 700 nm, from about 100 nm to about 900 nm, from about 700 nm to about 900 nm, from about 500 nm to about 900 nm, from about 300 nm to about 900 nm, or from about 300 nm to about 500 nm, but may not be limited thereto.

According to an embodiment of the present disclosure, the transparent substrate may have flexibility, but may not be limited thereto. By way of example, the transparent substrate may have one or more of flexibility and elongatibility, but may not be limited thereto.

According to an embodiment of the present disclosure, the transparent substrate may include a member selected from the group consisting of a polymer, glass, ITO, FTO, and combinations thereof, but may not be limited thereto. By way of example, the polymer may include a member selected from the group consisting of TAC (triacetylcellulose), PMMA (polymethyl methacrylate), PVA (polyvinyl alcohol), PC (polycarbonate), PE (polyethylene), PP (polypropylene), PS (polystyrene), PES (polyethersulfone), PEN (polyethylenenaphthalate), PI (polyimide), PDMS (polydimethylsiloxane), PET (polyethylene terephthalate), PAN (polyacrylonitrile), and combinations thereof, but may not be limited thereto. By way of example, if PDMS is used as the transparent substrate, the PDMS may be advantageous in that it is chemically stable, nontoxic, thermally stable, cheap, easy to handle, biocompatible, and has a high transparency and a linear elongation of about 50%, but disadvantageous in that it has a strong hydrophobicity and a very weak adhesive property. Therefore, a surface of the PDMS needs to be modified.

According to an embodiment of the present disclosure, a thickness of the graphene oxide layer may be in the range of from about 0.1 nm to about 10 nm, but may not be limited thereto. By way of example, the thickness of the graphene oxide layer may be in the range of from about 0.1 nm to about 10 nm, from about 0.3 nm to about 10 nm, from about 0.5 nm to about 10 nm, from about 1 nm to about 10 nm, from about 3 nm to about 10 nm, from about 5 nm to about 10 nm, from about 7 nm to about 10 nm, from about 0.1 nm to about 7 nm, from about 0.1 nm to about 5 nm, from about 0.1 nm to about 3 nm, from about 0.1 nm to about 1 nm, from about 0.1 nm to about 0.5 nm, or from about 0.1 nm to about 0.3 nm, but may not be limited thereto.

According to an embodiment of the present disclosure, the transparent electrode may further include a hard coating layer formed on the metal nanowire layer, but may not be limited thereto.

According to an embodiment of the present disclosure, the transparent electrode may further include a hard coating layer formed on the graphene oxide layer, but may not be limited thereto. By way of example, if the transparent electrode includes the graphene oxide layer, the transparent electrode may include the hard coating layer formed on the graphene oxide layer, but may not be limited thereto.

By way of example, the hard coating layer may include a member selected from the group consisting of acryl resin, polyvinylalcohol (PVA), polyethylene glycol) diacrylate (PEGDA), PEDOT:PSS [poly(3,4-ethylenedioxythiophene) poly(styrenesulfonate)], TiO$_2$/PEDOT:PSS, Teflon, a silver nanowire/polymer complex, a silane coupling agent, and combinations thereof, but may not be limited thereto.

By way of example, the silane coupling agent may include a member selected from the group consisting of methacryloxypropyl trimethoxysilane (MPTMS), glycidoxypropyl trimethoxysilane (GPTMS), vinyltriethoxysilane (VTES), methyltriethoxysilane (MTES), tetraethyl orthosilicate (TEOS), mercaptopropyltrimethoxysilane (MPTMS), titanium isopropoxide (TTIP), and combinations thereof, but may not be limited thereto.

According to an embodiment of the present disclosure, the hard coating layer may further include a highly refractive material and/or a photoinitiator, but may not be limited thereto. By way of example, the highly refractive material may include TTIP and/or GPTM, but may not be limited thereto. By way of example, the photoinitiator may include 1-hydroxy-cyclohexyl-phenylketone, but may not be limited thereto.

The 1-hydroxy-cyclohexyl-phenylketone may be represented by the following Chemical Formula 3, but may not be limited thereto:

[Chemical Formula 3]

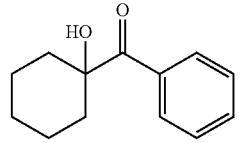

The transparent electrode of the present disclosure may include the metal nanowire layer formed by bonding a metal nanowire onto the transparent substrate by the self-assembled monolayer formed on the transparent substrate, and the graphene oxide layer formed on the nanowire layer by bonding the self-assembled monolayer and/or the nanowire to graphene oxide, but may not be limited thereto. By way of example, if the transparent substrate has flexibility and/or elongatibility, the metal nanowire network included in the metal nanowire layer and the graphene oxide layer also have a high flexibility and a high elongatibility. Therefore, the transparent electrode of the present disclosure can maintain excellent conductivity and resistance even when being bent or elongated.

The transparent electrode of the present disclosure may be used for manufacturing a solar cell, a display, a transistor, or a touch panel, but may not be limited thereto.

In a second aspect of the present disclosure, there is provided a method for manufacturing a transparent electrode, including: forming a self-assembled monolayer including a polar functional group on a transparent substrate; and forming a metal nanowire layer on the self-assembled monolayer.

By way of example, according to the method for manufacturing the transparent electrode of the present disclosure, the self-assembled monolayer may be formed on a hydrophobic substrate by using a self-assembled monolayer forming material including a polar functional group including a member selected from the group consisting of an amine group, an amide group, pyrrole group, hydroxyl group, thiol group, an epoxide group, a halide group, and combinations thereof, which can be readily bonded to a metal nanowire, in order to enhance hydrophilicity of the hydrophobic substrate having a weak bonding force with respect to the metal nanowire, and, thus, a bonding force with respect to the metal nanowire may be increased; the metal nanowire layer is formed on the self-assembled monolayer; and the graphene oxide layer may be formed on the metal nanowire layer in order to increase the stability of the metal nanowire layer, but may not be limited thereto. By way of example, the graphene oxide layer may be bonded to the self-assembled monolayer by one selected from the group consisting of an electrostatic interaction, an amide bonding, an ester bonding, a thioester bonding, and combinations thereof, but may not be limited thereto.

According to an embodiment of the present disclosure, the forming the self-assembled monolayer including the polar functional group on the transparent substrate may include treating the transparent substrate with an organic compound represented by the following Chemical Formula 1, but may not be limited thereto:

X-A-Y.     [Chemical Formula 1]

Herein, in the formula, X includes a member selected from the group consisting of a silane group, an alkylamine group, and a phosphonate group, Y includes a polar functional group selected from the group consisting of an amine group, an amide group, pyrrole group, hydroxyl group, thiol group, an epoxide group, and a halide group, and A as a carbon molecular axis includes a member selected from the group consisting of oxygen, nitrogen, phosphorus, sulfur, silicon, or germanium atom; a unsaturated hydrocarbon group including C≡C, C═C, C≡C—C≡C, C≡C—C═C, or C═C—C═C; N═N, —NH—CO— or a benzene ring-containing functional group; and combinations thereof.

By way of example, the silane group may be represented by the following Chemical Formula 2, but may not be limited thereto:

[Chemical Formula 2]

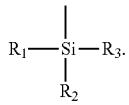

Herein, each of the $R_1$ to $R_3$ is independently hydrogen, a halogen element, an alkyl group, an alkoxy group, an aralkyl, or an aryl group, and may include one or more oxygen, nitrogen, sulfur, or metal atoms, but may not be limited thereto.

By way of example, the alkylamine group may be represented by —$R_4$—$NH_2$; the phosphonate group may be represented by —$PO_3H_2$; the amine group may be represented by —$NH_2$, —$N(R_5)H$, $N(R_6)_2$, or $N(R_2)$—$NH_2$; the amide group may be represented by —$C(O)NH_2$; the pyrrole group may be represented by —$C_4H_4NH$; and the halide group may include —F, —Cl, —Br, or —I, but may not be limited thereto.

By way of example, each of the $R_4$ to $R_7$ is independently hydrogen, a halogen element, an alkyl group, an alkoxy group, an aralkyl, or an aryl group, and may include one or more oxygen, nitrogen, sulfur, or metal atoms, but may not be limited thereto.

By way of example, each of the alkyl group or the alkoxy group may independently include a linear or branched hydrocarbon group having 1 to about 22 carbon atoms, or 1 to about 20 carbon atoms, or 1 to about 12 carbon atoms, or 1 to about 10 carbon atoms, or 1 to about 6 carbon atoms, but may not be limited thereto. The alkyl group may include the hydrocarbon group which loses one or more hydrogen atoms and has one or more bond lines, but may not be limited thereto. By way of example, the alkyl group may be methyl, ethyl, propyl, isopropyl, n-butyl, t-butyl, isobutyl, pentyl, hexyl, isohexyl, heptyl, 4,4-dimethylpentyl, octyl, 2,2,4-trimethylpentyl, nonyl, decyl, undecyl, dodecyl, and isomers thereof, and the alkoxy group may be an alkoxy group including the above-exemplified alkyl group, but may not be limited thereto. The alkyl group and the alkoxy group may be substituted by a halogen element, an alkyl group, an alkoxy group, an aralkyl, or an aryl group, but may not be limited thereto.

By way of example, the aralkyl may include an aromatic ring bonded via the alkyl group as described above, i.e., an aryl-substituted alkyl group. As a non-limiting example, the aralkyl may be an arylalkyl group in which an aryl group is attached to a linear or branched alkyl group having 1 to about 22 carbon atoms, or 1 to about 20 carbon atoms, or 1 to about 10 carbon atoms, or 1 to about 6 carbon atoms, but may not be limited thereto. Examples of the aralkyl may include benzyl, phenylethyl, phenylpropyl, phenylbutyl, phenylpentyl, phenylhexyl, biphenylmethyl, biphenylethyl, biphenylpropyl, biphenylbutyl, biphenylpentyl, biphenylhexyl, naphthyl, and the like, but may not be limited thereto.

By way of example, the aryl group may include a monocyclic or bicyclic aromatic ring, such as, phenyl and substituted phenyl, and a conjugated group, such as naphthyl, phenanthrenyl, indenyl, tetrahydronaphthyl, and indanyl, but may not be limited thereto. Therefore, the aryl group may include one or more rings having 6 or more atoms and may include 5 or less rings having 22 or less atoms, and double bonds may exist alternately (resonantly) between adjacent carbon atoms or appropriate hetero atoms, but may not be limited thereto. The aryl group may be optionally substituted by one or more groups including a halogen (for example, F, Br, Cl, or I), an alkyl (for example, methyl, ethyl, propyl), an alkoxy (for example, methoxy or ethoxy), hydroxyl, carboxyl, carbamoyl, an alkyloxy carbonyl, nitro, an alkenyloxy, trifluoromethyl, an amino, cycloalkyl, an aryl, a heteroaryl, cyano, $S(O)_m$ (m=0, 1, 2), or thiol, but may not be limited thereto.

By way of example, the self-assembled monolayer may include a member selected from the group consisting of [3-(2-aminoethylamino)propyl]trimethoxysilane, 3-glycidyloxypropyltrimethoxysilane, 3-chloropropyltriethoxysilane, mercaptopropyltrimethoxysilane (MPTMS), N-(2-aminoethyl)-3-aminopropyltrimethoxysilane, (3-aminopropyl) trimethoxysilane, 3-trimethoxysilylpropyl)diethylenetriamine, (3-aminopropyl)triethoxysilane, N-(trimethoxysilylpropyl)ethylenediamine triacetic acid, hexadecanethiol (HDT), epoxyhexyltriethoxysilan, ethylenediamine, and combinations thereof, but may not be limited thereto.

By way of example, the surface of the transparent substrate has hydrophobicity and thus is not readily bonded to a hydrophilic metal nanowire due to a weak affinity with the hydrophilic metal nanowire. However, if the self-assembled monolayer is formed on the transparent substrate, the metal nanowire is bonded to the self-assembled monolayer due to a polarity (i.e., hydrophilicity) of the self-assembled monolayer and thus can be readily deposited and attached onto the transparent substrate, but may not be limited thereto.

According to an embodiment of the present disclosure, the forming the metal nanowire layer on the self-assembled monolayer may include treating the self-assembled monolayer with a metal-nanowire or alloy-nanowire including a member selected from the group consisting of Ni, Co, Fe, Pt, Au, Ag, Al, Cr, Cu, Mg, Mn, Mo, Rh, Si, Ta, Ti, W, U, V, Zr, Ge, and combinations thereof, but may not be limited thereto.

By way of example, the bonding between the metal nanowire and the self-assembled monolayer may be formed by an electrostatic interaction, but may not be limited thereto.

By way of example, the forming the metal nanowire layer on the self-assembled monolayer may be performed by a spray coating method, a spin coating method, or a dip coating method, but may not be limited thereto.

According to an embodiment of the present disclosure, the metal nanowire layer may be formed via a bonding between the polar functional group contained in the self-assembled monolayer and the metal nanowire, but may not be limited thereto. By way of example, the bonding may be formed by an electrostatic interaction, but may not be limited thereto.

According to an embodiment of the present disclosure, the method may further include forming a graphene oxide layer on the metal nanowire layer, but may not be limited thereto.

By way of example, the graphene oxide layer may be bonded to the self-assembled monolayer, or may be bonded to the metal nanowire layer, or may be bonded to all of the self-assembled monolayer and the metal nanowire layer, but may not be limited thereto.

According to an embodiment of the present disclosure, the graphene oxide layer may be formed via a bonding between the polar functional group contained in the self-assembled monolayer and the graphene oxide, but may not be limited thereto.

By way of example, in order to induce the bonding between the polar functional group contained in the self-assembled monolayer and the graphene oxide, a member selected from the group consisting of an acid catalyst, a base catalyst, heating, light irradiation, and combinations thereof may be used, but may not be limited thereto.

According to an embodiment of the present disclosure, the graphene oxide layer may be bonded to the self-assembled monolayer by one selected from the group consisting of an electrostatic interaction, an amide bonding, an ester bonding, a thioester bonding, and combinations thereof between the polar functional group contained in the self-assembled monolayer and the graphene oxide, but may not be limited thereto. By way of example, the amide bonding may be formed between carboxyl group (—COOH) included in the graphene oxide and amine group (—NH$_2$) included in the self-assembled monolayer, but may not be limited thereto.

According to an embodiment of the present disclosure, the graphene oxide layer may be bonded to the metal nanowire layer by an electrostatic interaction, but may not be limited thereto.

According to an embodiment of the present disclosure, the method may further include reducing the graphene oxide contained in the graphene oxide layer after forming the graphene oxide layer on the metal nanowire layer, but may not be limited thereto.

According to an embodiment of the present disclosure, the method may further include treating with an acidic solution to form amide bonding between amine group contained in the self-assembled monolayer and carboxyl group contained in the graphene oxide layer after forming the graphene oxide layer on the metal nanowire layer, but may not be limited thereto. By way of example, the acidic solution may include a member selected from the group consisting of hydrochloric acid, nitric acid, sulfuric acid, and combinations thereof, but may not be limited thereto. Byway of example, since the amide bonding is formed, the graphene oxide layer can be formed in a more physically and/or chemically stable manner. Thus, the metal nanowire layer present between the graphene oxide layer and the substrate is not easily separated from the substrate but stably distributed on the substrate, but may not be limited thereto.

According to an embodiment of the present disclosure, the method may further include forming a hard coating layer on the metal nanowire layer, but may not be limited thereto.

According to an embodiment of the present disclosure, the method may further include forming a hard coating layer on the graphene oxide layer after forming the graphene oxide layer on the metal nanowire layer, but may not be limited thereto. By way of example, if the transparent electrode is manufactured as including a graphene oxide layer, the method for manufacturing the transparent electrode may include forming a hard coating layer on the graphene oxide layer after forming the graphene oxide layer on the metal nanowire layer, but may not be limited thereto.

By way of example, the hard coating layer may include a member selected from the group consisting of acryl resin, polyvinylalcohol (PVA), polyethylene glycol) diacrylate (PEGDA), PEDOT:PSS [poly(3,4-ethylenedioxythiophene) poly(styrenesulfonate)], TiO$_2$/PEDOT:PSS, Teflon, a silver nanowire/polymer complex, methacryloxypropyl trimethoxysilane (MPTMS), glycidoxypropyl trimethoxysilane (GPTMS), vinyltriethoxysilane (VTES), methyltriethoxysilane (MTES), tetraethyl orthosilicate (TEOS), mercaptopropyltrimethoxysilane (MPTMS), titanium isopropoxide (TTIP), and combinations thereof, but may not be limited thereto.

MODE FOR CARRYING OUT THE INVENTION

Hereinafter, the present disclosure will be explained in detail with reference to examples. However, the present disclosure may not be limited thereto.

1. Manufacturing of Transparent Electrode

After PDMS (SYLGARD 184, Dow Corning) including a mixture of a base and a linker solution at 10:1 was ultrasonicated at a low temperature, bubbles were removed in a vacuum desiccator. The PDMS solution prepared as such was poured onto a film and left for a day to form a PDMS substrate. Then, the PDMS substrate is transferred into a vacuum oven at 70° C. to perform an oxygen/argon plasma process for 1 minute with 80 W at 50 sccm, thereby forming an oxygen functional group on a surface of the PDMS substrate. Then, in order to form a self-assembled monolayer (SAM), the PDMS substrate was incubated in a 10% silane solution in alcohol at 60° C. for 90 minutes and then, washed with ethanol and dried for 1 hour. As the silane, [3-(2-aminoethylamino)propyl]trimethoxysilane, 3-aminopropyltriethoxysilane, 3-mercaptopropyltrimethoxysilane, 3-glycidyloxypropyltrimethoxysilane, N-(2-aminoethyl)-3-aminopropyltrimethoxysilane, and 3-chloropropyltriethoxysilane were used, and the products of Aldrich were used.

Then, in order to form a metal nanowire layer, a silver nanowire (Jung Won Corporation) was washed with acetone several times and a process of spray-coating a silver nanowire solution dispersed to ⅙ in ethanol on the PDMS substrate at 500 rpm for 90 seconds by using a spray coater (Dae Han Spray) was repeated three times and then, the coated PDMS substrate was dried in an oven at 65° C. for 30 minutes. Then, after 200 µl of a 0.01 mg/mL graphene oxide solution was spray-coated on the substrate at 4,000 rpm, the coated substrate was dried in a vacuum oven at 65° C. for 30 minutes to form a graphene oxide layer, so that a transparent electrode was manufactured. The graphene oxide used in the present Example was prepared by using a modified Hummer's method.

In order to more strongly bond the graphene oxide layer included in the transparent electrode to the transparent electrode, the transparent electrode was treated with an acidic solution to form amide bonding between carboxyl group contained in the graphene oxide and amine group contained in the self-assembled monolayer. To be specific, after the transparent electrode including the graphene oxide layer was put into a round bottom flask (RBF), a 10% HCl solution was vaporized and then reacted at 60° C. for 1 hour while being circulated in the flask. Then, the transparent electrode was washed with water and then dried in an oven.

2. Formation of Hard Coating Layer on Transparent Electrode

In the present Example, an additional hard coating layer was formed on the manufactured transparent electrode in order to increase the stability of the transparent electrode. Firstly, polyethylene glycol) diacrylate (PEGDA) dissolved in an amount of 2 wt. % in a dimethylformamide (DMF) solution and 1-hydroxy-cyclohexyl-phenylketone as a radical photoinitiator were mixed at 50:1, and a spin coating was performed at 500 rpm by adding 1 mL of the mixed solution dropwise. Then, the mixed solution was cured by exposure to light for 1 minute in a nitrogen atmosphere, so that a hard coating layer was formed. Further, as a highly refractive material, a mixture of titanium isopropoxide (TTIP) as a precursor of $TiO_2$ and GPTMS was included.

3. Analysis of Surface Characteristic-Measurement of Water Contact Angle

In the present Example, water contact angles on surfaces of a PDMS substrate (a of FIG. 1) which adopted SAM formed by using N-(2-aminoethyl)-3-aminopropyltrimethoxysilane and to which a surface treatment was not performed, a PDMS substrate (b of FIG. 1) of which a surface was treated with oxygen plasma (100 W, 1 min), a PDMS substrate (c of FIG. 1) including SAM/silver nanowire layer/graphene oxide layer, and a PDMS substrate (d of FIG. 1) including silver nanowire layer/graphene oxide layer were measured by using WCA measurements (SEO Phoenix 300 microscope) to analyze hydrophobicity of the surfaces of the substrates.

FIG. 1 provides optical images with which water contact angles of transparent electrodes are measured according to the present Example. Referring to a to d of FIG. 1, it was observed that the PDMS including SAM/silver nanowire layer/graphene oxide layer and the PDMS including silver nanowire layer/graphene oxide layer had a weaker surface hydrophobicity than the PDMS to which a surface treatment was not performed, but had a stronger surface hydrophobicity than the PDMS of which a surface was treated with oxygen plasma.

Then, sustainability of a surface treatment effect on the PDMS was analyzed.

In a general polymer, a migration phenomenon continuously occurs, and, thus, molecules continuously move. Even if a surface of the polymer is modified by using a plasma process or a physical method, molecules in the modified surface move toward the inside or the bottom of the polymer substrate due to the migration phenomenon. Therefore, non-modified original molecules are exposed at the surface of the polymer, and, thus, an effect of surface modification was not sustained and a property of the surface returns to its original condition as time passes. By way of example, if a plasma process is performed to a PDMS substrate, surface hydrophilicity caused by the plasma process disappears due to the migration phenomenon after about 1 hour passes.

Figure 2:
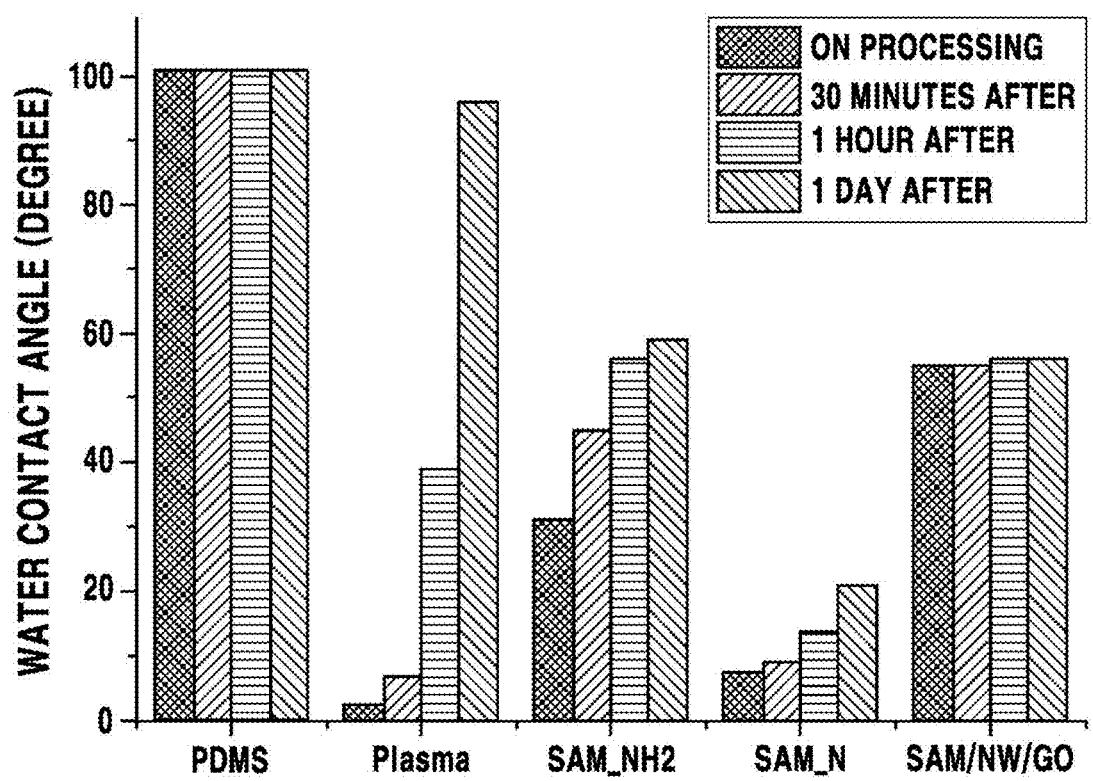
FIG. 2 is a graph showing a change in water contact angle of a transparent electrode over time according to an Example of the present disclosure.

In the present Example, sustainability of surface hydrophilicity in the case of treating a plasma-processed PDMS substrate with SAM was evaluated and shown in FIG. 2.

FIG. 2 is a graph showing a change in water contact angle of a transparent electrode over time according to the present Example. Referring to FIG. 2, it was confirmed that in the case of treating the PDMS with an oxygen plasma, hydrophilicity caused by a surface treatment almost disappeared after 1 day passed, but in the case of treating the PDMS with SAM and in the case of forming SAM/silver nanowire layer/graphene oxide layer on the PDMS, hydrophilicity caused by a surface treatment was sustained even after time passed.

This was because the migration phenomenon was suppressed by a strong interaction between silver and a ligand caused by formation of the silver nanowire layer on the SAM. Thus, it was confirmed that a surface modification effect of the hydrophobic polymer substrate was stably maintained for a long time as compared with a case of treating the substrate with plasma only.

Then, water contact angles of PDMS/a SAM/a silver nanowire were measured according to a reaction time with a silane solution by varying a treatment time of the silane solution during a SAM forming process and was evaluated to analyze a degree of hydrophilicity caused by surface modification of PDMS. The silane solution used herein was a [3-(2-aminoethylamino)propyl]trimethoxysilane solution, and the measured water contact angles as shown in the graph of FIG. 3.

Figure 3:
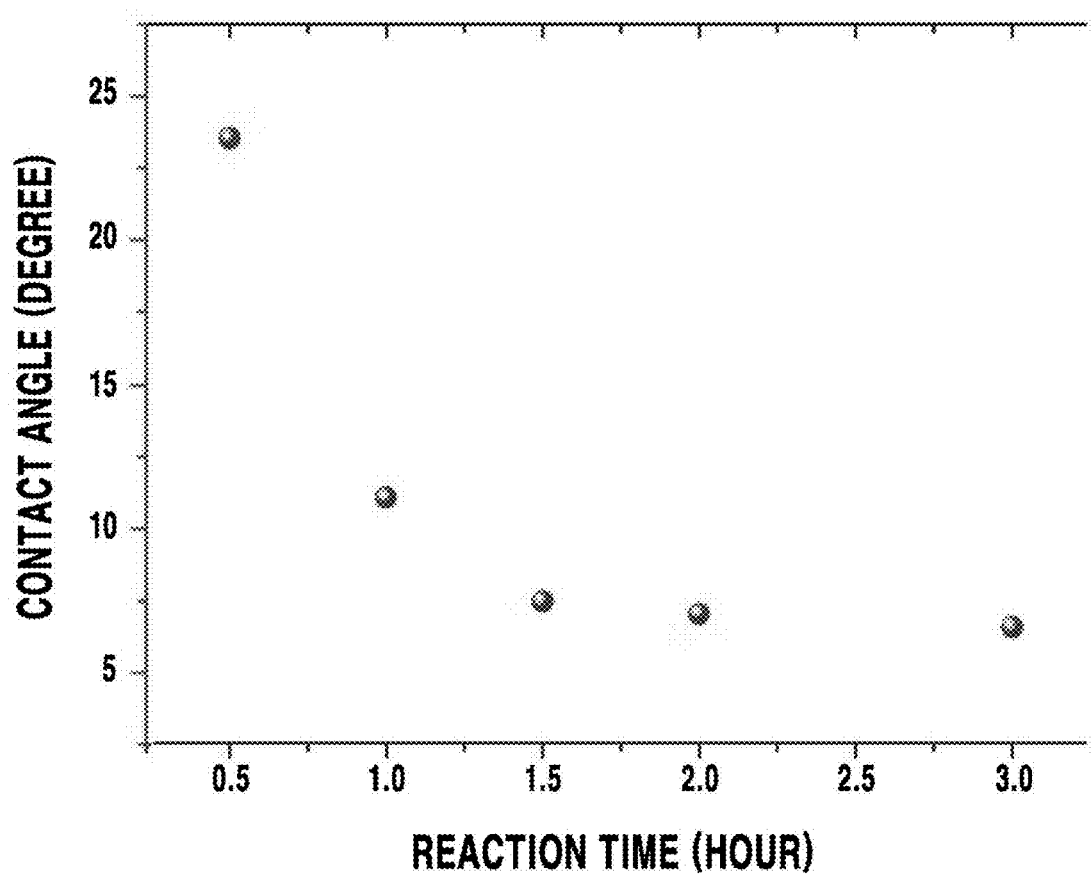
FIG. 3 is a graph obtained by measuring water contact angles of a transparent electrode according to an Example of the present disclosure.

FIG. 3 is a graph obtained by measuring water contact angles of a transparent electrode according to the present Example. Referring to FIG. 3, it was observed that when a reaction time was 1.5 hours (90 minutes) or more, there was no great change in water contact angle (i.e., hydrophilicity).

Figure 4:
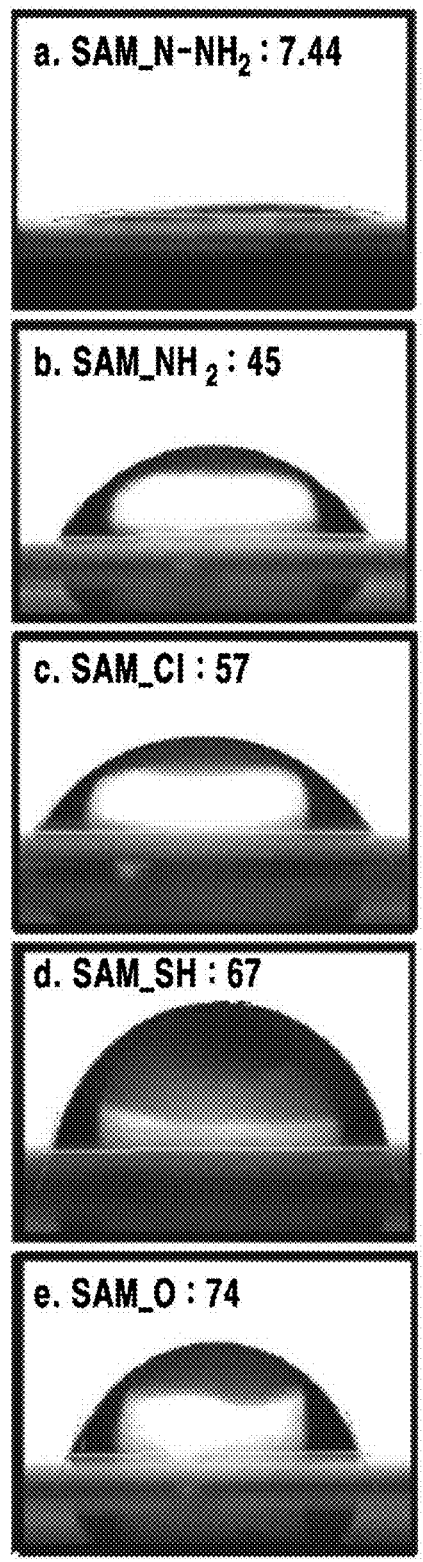
FIG. 4 provides optical images with which water contact angles of a transparent electrode are measured according to an Example of the present disclosure.

Then, a water contact angle depending on a kind of a polar functional group included in SAM was measured and shown in FIG. 4. FIG. 4 provides optical images with which water contact angles of a transparent electrode are measured according to the present Example. When SAM was formed by using [3-(2-aminoethylamino)propyl]trimethoxysilane and included nitrogen (N) and a —NH$_2$ functional group (a. SAM_N—NH$_2$), a water contact angle measured was 7.44°; when SAM was formed by using (3-aminopropyl)triethoxysilane and included a —NH$_2$ functional group (b. SAM_NH$_2$), a water contact angle measured was 45°; when SAM was formed by using 3-chloropropyltriethoxysilane and included a Cl functional group (c. SAM_Cl), a water contact angle measured was 57°; when SAM was formed by using 3-mercaptopropyltrimethoxysilane and included a —SH functional group (d. SAM_SH), a water contact angle measured was 67°; and when SAM was formed by using 3-glycidyloxypropyltrimethoxysilane and included an oxygen (O) functional group (e. SAM_O), a water contact angle measured was 74° (see FIG. 4).

According to this result, when the SAM_N—NH$_2$ including N and a —NH$_2$ functional group was formed on the PDMS substrate, the highest surface hydrophilicity was obtained.

Figure 5:
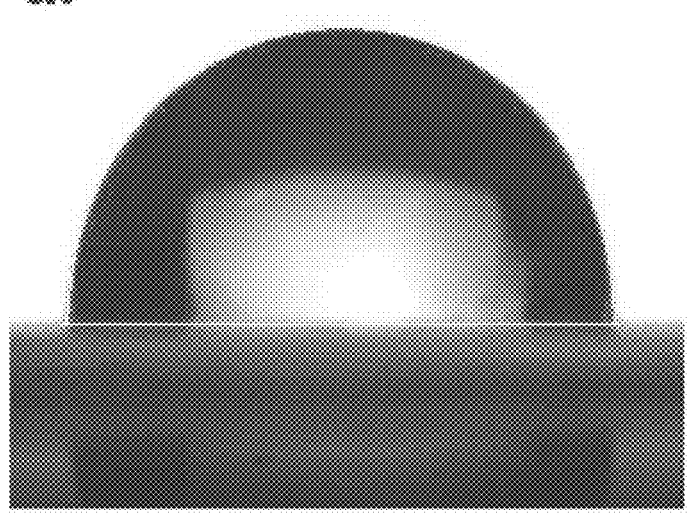
FIG. 5 provides optical images with which water contact angles of a transparent electrode are measured according to an Example of the present disclosure.
Figure 5:
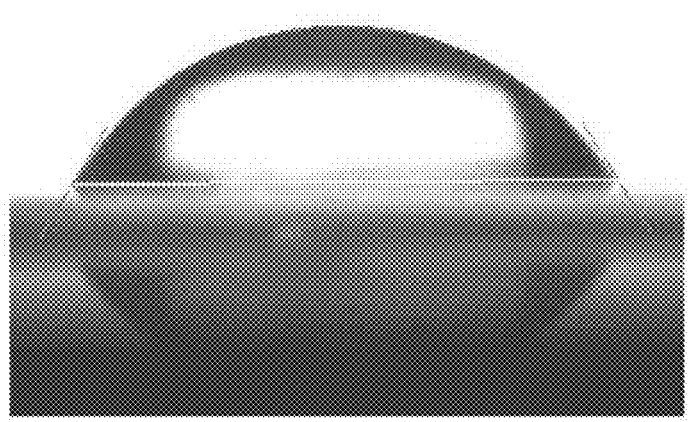

Then, a transparent electrode was manufactured by forming the SAM_N—NH$_2$ on the PDMS substrate by using [3-(2-aminoethylamino)propyl]trimethoxysilane and forming a silver nanowire layer and a graphene oxide layer on the SAM and then performing an acid treatment to form a strong bonding between the SAM and graphene oxide, thereby forming amide bonding. One week after formation of the amide bonding, a water contact angle was measured to estimate whether or not the stability of the film was sustained, and shown in FIG. 5. FIG. 5 provides optical images with which water contact angles of a transparent electrode are measured according to the present Example. When amide bonding was not formed, a water contact angle measured was 89° (a of FIG. 5), whereas when amide bonding was formed, a water contact measured was 53° (b of FIG. 5). According to this result, it was confirmed that when amide bonding was formed between graphene oxide and SAM, the film surface and the graphene oxide were strongly bonded to each other, so that a more uniform surface was formed and hydrophilicity was stably maintained for a long time. That is, since the strong bonding between the surface and the upper layer material was stably maintained, a physically stable transparent electrode was manufactured.

4. Analysis of Surface Characteristic-Surface Uniformity

Figure 6:
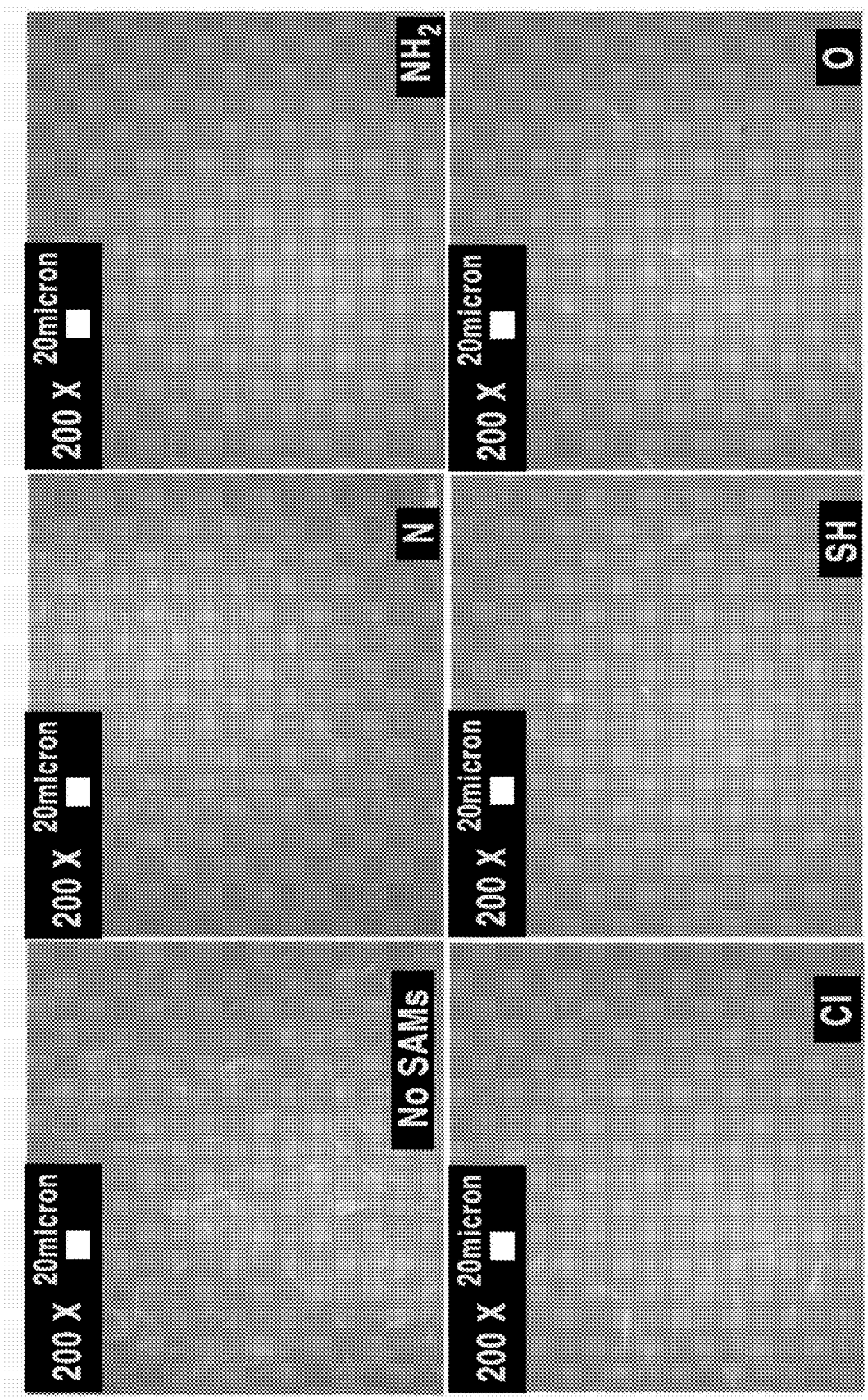
FIG. 6 provides optical images with which surface uniformity of a transparent electrode is analyzed according to an Example of the present disclosure.

In the present Example, SAM/silver nanowire layer were formed on a PDMS substrate and then, surface uniformity was measured by using an optical microscope (Olympus BX51, Microscopes Inc. wm003900a S39a) and shown in FIG. 6.

FIG. 6 provides optical images with which surface uniformity of a transparent electrode is analyzed according to the present Example. Referring to FIG. 6, it was observed that when SAM_N including a N functional group was formed, more nanowires were bonded to a surface thereof and surface uniformity was excellent as compared with the case where a SAM including another functional group was formed.

5. Analysis of Surface Characteristic—XPS Analysis

In the present Example, ratios of C:X in the SAM_N and the SAM_NH$_2$ were measured by using an X-ray photoelectron spectroscope (XPS) to measure degrees of hydrolysis.

Figure 7:
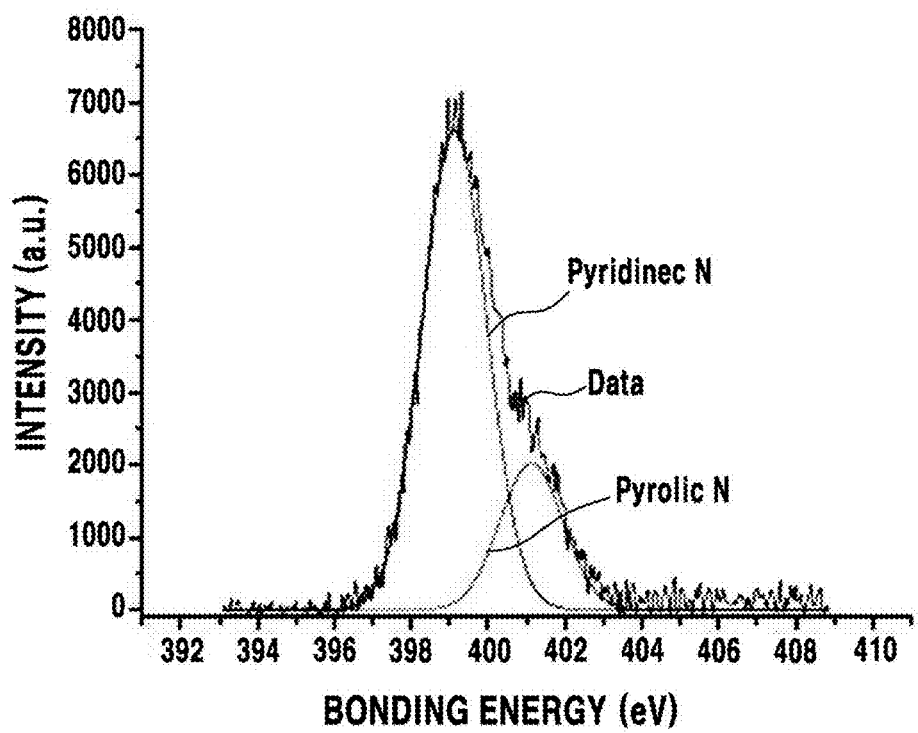
FIG. 7 provides the results of XPS analysis of a surface characteristic of a transparent electrode according to an Example of the present disclosure.
Figure 7:
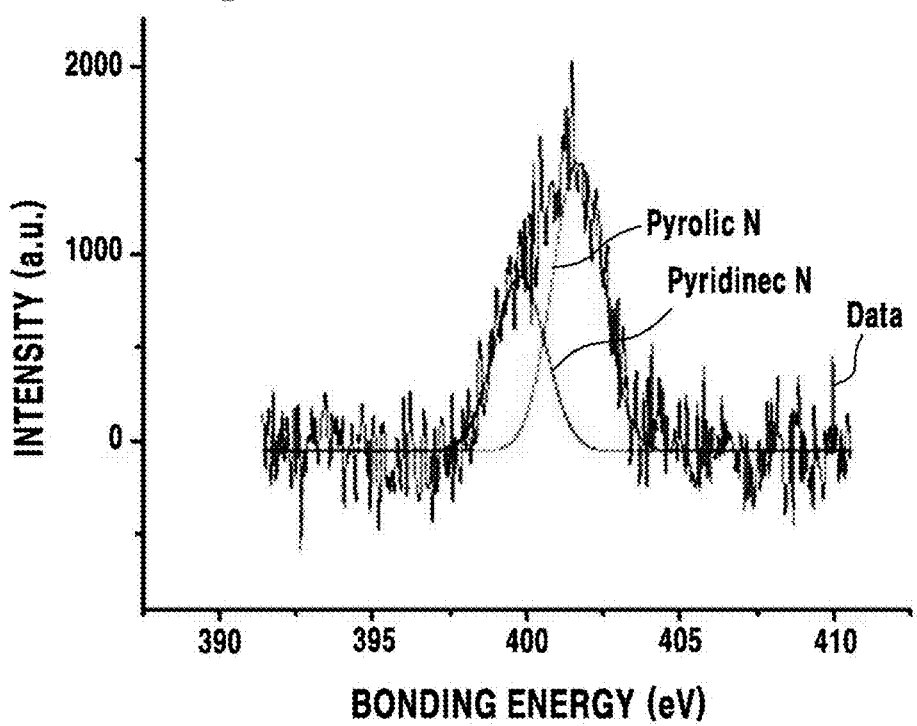

FIG. 7 provides the results of XPS analysis of a surface characteristic of transparent electrodes according to the present Example. As illustrated in FIG. 7, a N-peak was not measured from the PDMS substrate, but N-peaks were shown in the SAM_N and the SAM_NH$_2$. The SAM_N showed the higher N-peak.

Figure 8:
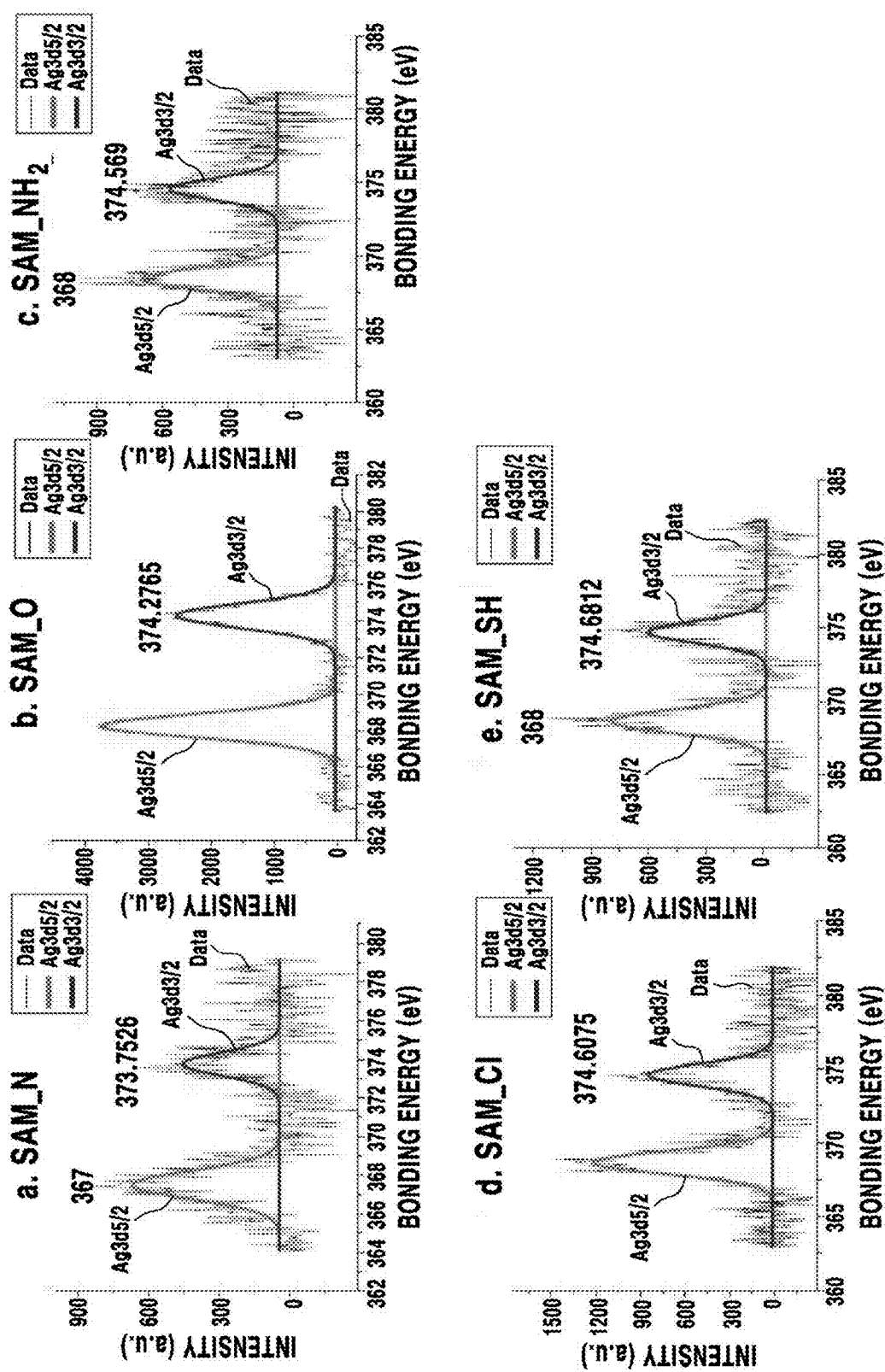
FIG. 8 provides the results of XPS analysis of a surface characteristic of a transparent electrode according to an Example of the present disclosure.
Figure 9:
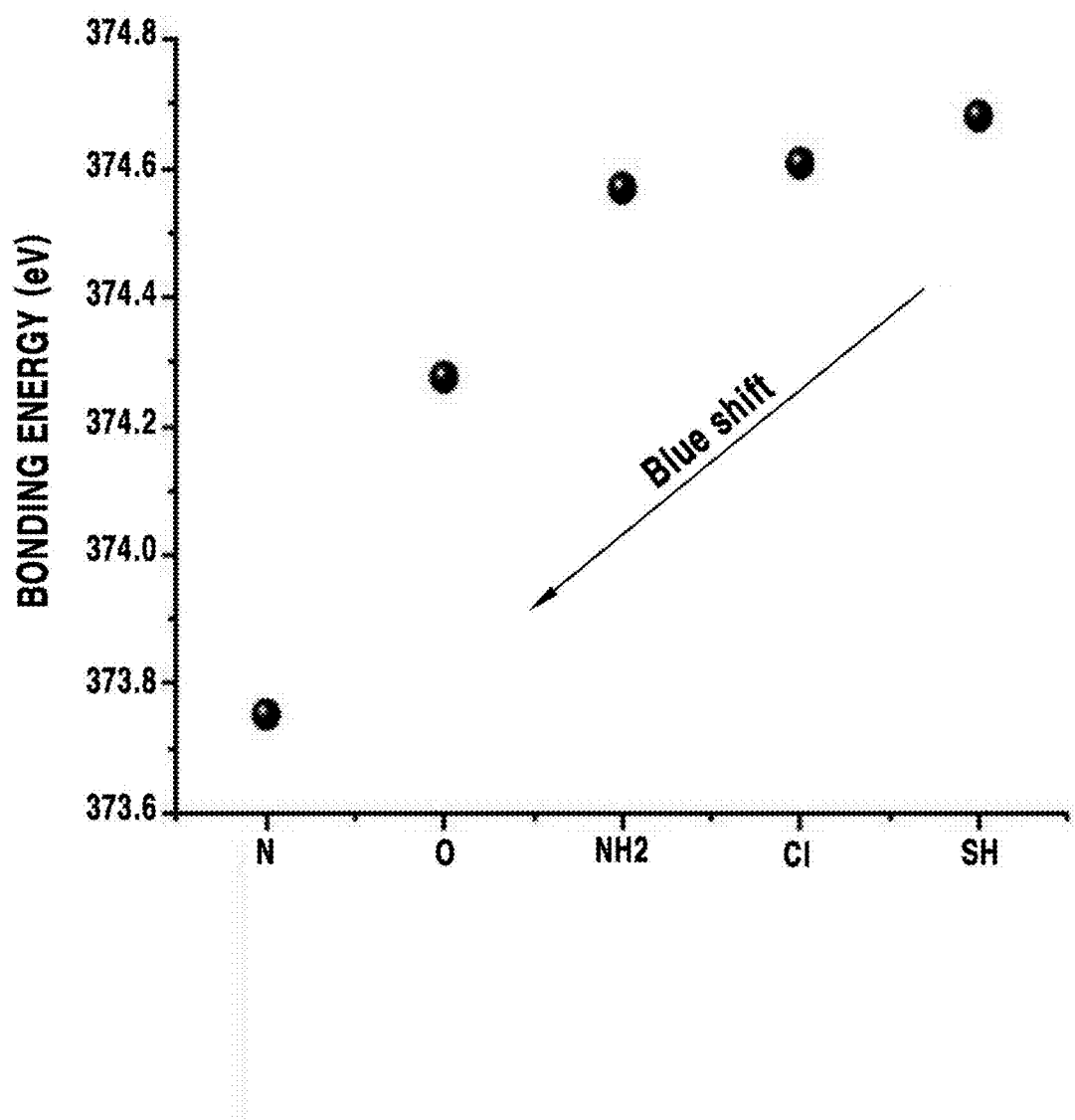
FIG. 9 provides the result of XPS analysis of a surface characteristic of a transparent electrode according to an Example of the present disclosure.

Then, degrees of shift of an Ag3d$_{3/2}$ peak and an Ag3d$_{5/2}$ peak depending on a kind of functional group included in SAM formed on the PDMS substrate were evaluated and shown in FIG. 8 and FIG. 9.

FIG. 8 and FIG. 9 provide the results of XPS analysis of a surface characteristic of transparent electrodes according to the present Example. According to FIG. 8 and FIG. 9, a Ag3d$_{3/2}$ peak of the SAM_N showed a blue shift as compared with the other cases because of an excellent contact characteristic.

Figure 10:
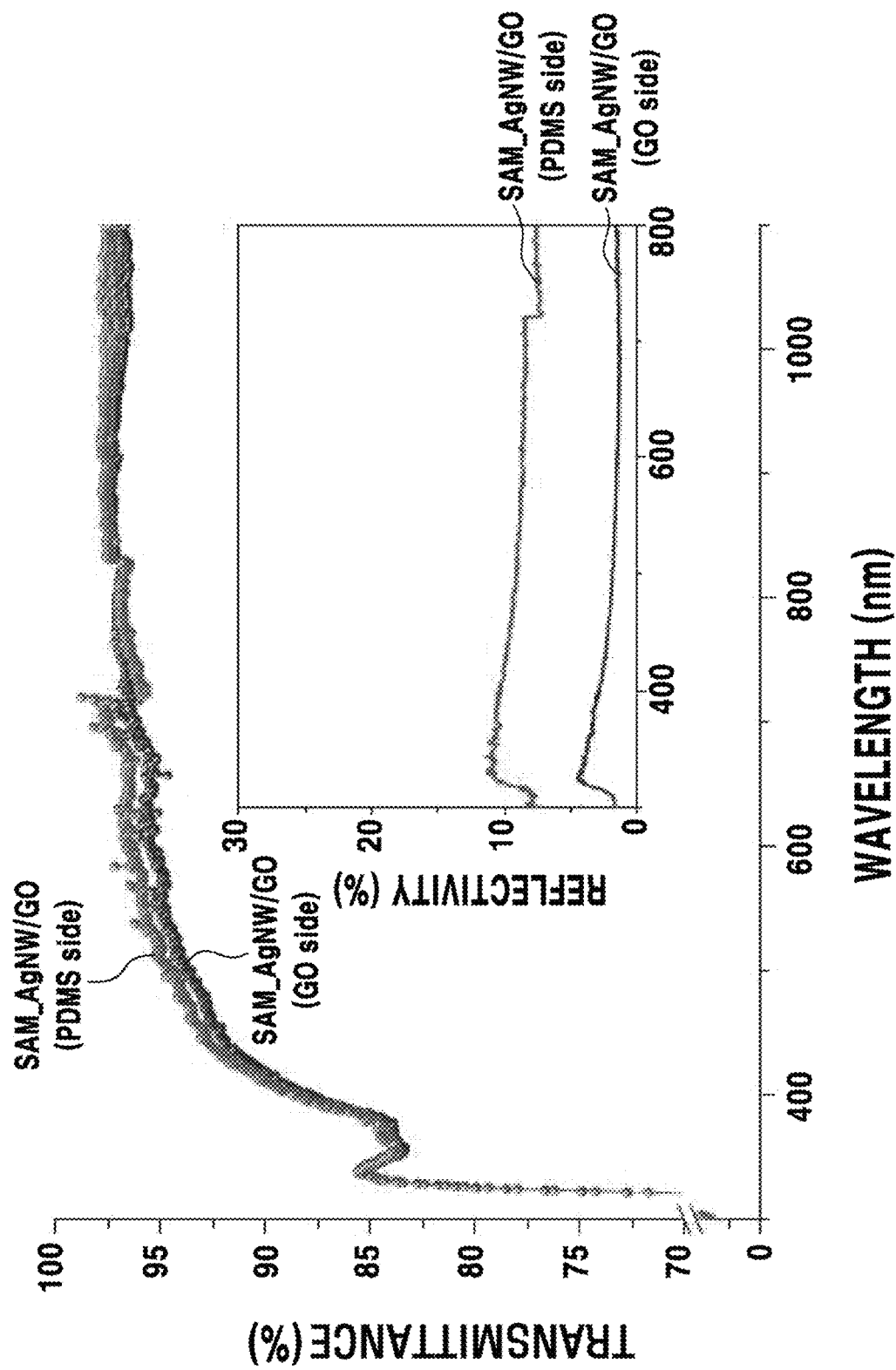
FIG. 10 is a graph obtained by measuring transmittances of a transparent electrode according to an Example of the present disclosure.

6. Analysis of Transparent Electrode Characteristic-Measurement of Transmittance In the present Example, transmittance of the manufactured transparent electrode was measured and shown in the graph of FIG. 10. A SAM was the SAM_N—NH$_2$ formed by using [3-(2-aminoethylamino)propyl]trimethoxysilane, and transmittance was measured by using a UV-Vis spectrophotometer (Varian Cary 5000). FIG. 10 is a graph obtained by measuring transmittances of transparent electrodes according to the present Example. FIG. 10 shows a result of measurement of transmittance from a front surface (a surface on which graphene oxide is formed, GO side) and a rear surface (PDMS surface, PDMS side) of the transparent electrode including SAM/silver nanowire layer/graphene oxide layer. As a result of measurement of transmittance from the front surface of the transparent electrode, at 550 nm, the transmittance was 94%, and in the range of from 450 nm to 1100 nm, the average transmittance was 96%. As a result of measurement of transmittance from the rear surface of the transparent electrode, at 550 nm, the transmittance was 95%, and in the range of from 450 nm to 1100 nm, the average transmittance was 96%. Considering that a general transparent has the transmittance of about 90%, it was confirmed that the transparent electrode of the present disclosure had an excellent transmittance.

7. Comparison in Electrode Surface Depending on Presence/Absence of SAM

Figure 11:
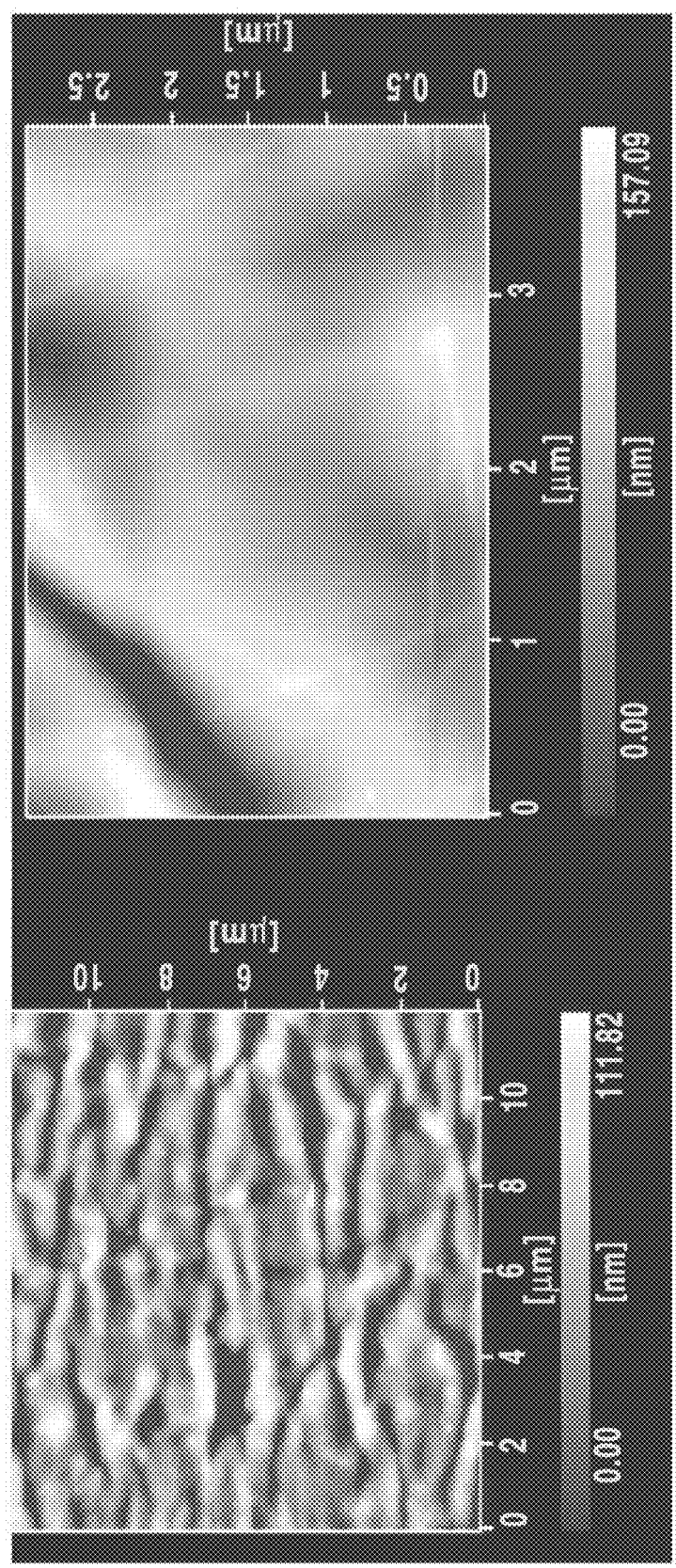
FIG. 11 provides atomic force microscopic images showing surface characteristics of a transparent electrode according to an Example of the present disclosure.

In the present Example, comparative analysis was conducted with respect to whether or not a silver nanowire layer and a graphene oxide layer are sufficiently formed on a PDMS on which a SAM is not formed. FIG. 11 provides images obtained by using an atomic force microscope (AFM, Digital Instruments D3100, PSIA XE-100) in the case where a silver nanowire layer and a graphene oxide layer are formed on a PDMS substrate on which a SAM is not formed. Referring to FIG. 11, it was observed that the graphene oxide layer was not uniformly formed due to lack of an interaction between the PDMS substrate and the nanowire or between the PDMS substrate and the graphene oxide. Further, it was analyzed that the nanowire layer was easily separated and a resistance was high accordingly.

Figure 12:
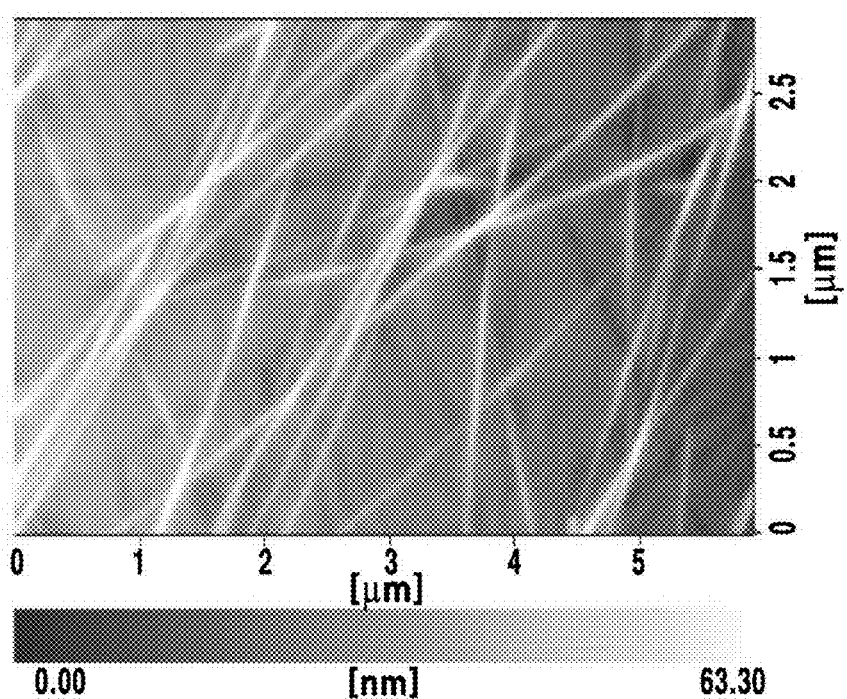
FIG. 12 provides atomic force microscopic images showing surface characteristics of a transparent electrode according to an Example of the present disclosure.
Figure 12:
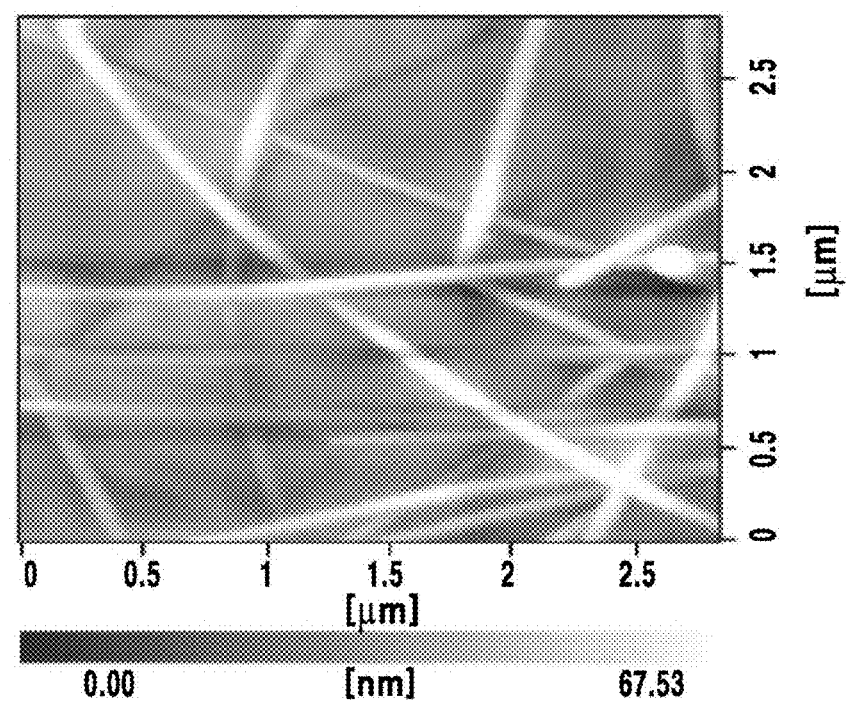

FIG. 12 provides atomic force microscopic images showing surface characteristics of a transparent electrode according to the present Example, and showing the case where the SAM_N—NH$_2$ was formed by using [3-(2-aminoethylamino)propyl]trimethoxysilane and only a silver nanowire layer was formed on the SAM (a of FIG. 12) and the case where a silver nanowire layer and a graphene oxide layer were formed on the SAM (b of FIG. 12). Referring to the images of FIG. 12, it could be seen that the nanowire layer and the graphene oxide layer were stably and uniformly formed.

Figure 13:
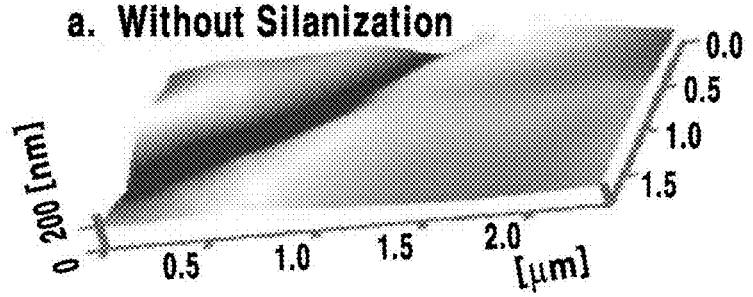
FIG. 13 provides atomic force microscopic images showing surface characteristics of a transparent electrode according to an Example of the present disclosure.
Figure 13:
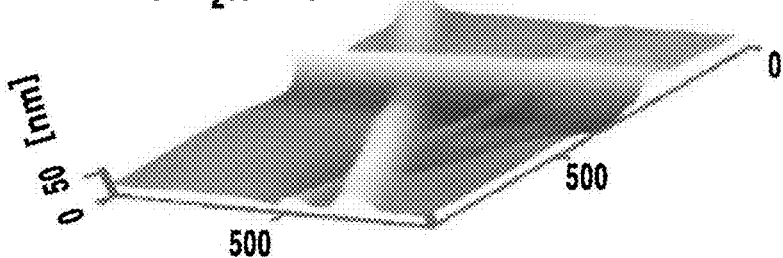
Figure 13:
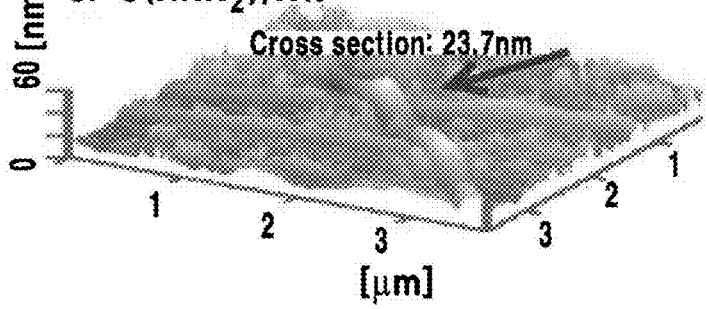
Figure 13:
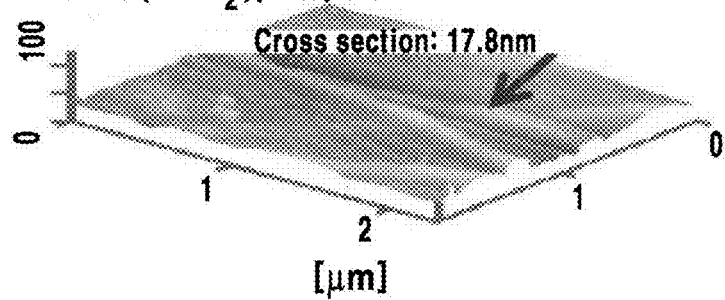

FIG. 13 provides atomic force microscopic images showing surface characteristics of a transparent electrode according to the present Example, and showing results of atomic force microscopic measurement of surface uniformity on a PDMS substrate on which silver nanowire layer/graphene oxide layer were formed without SAM (a. Without silanization), a PDMS substrate on which SAM was formed by using (3-aminopropyl)triethoxysilane and then nanowire layer/graphene oxide layer were formed (b. S(NH$_2$)/NW/GO, a PDMS substrate on which a SAM was formed by using [3-(2-aminoethylamino)propyl]trimethoxysilane and then only a nanowire layer was formed (c. S(NNH$_2$)/NW)), and a PDMS substrate on which a SAM was formed by using [3-(2-aminoethylamino)propyl]trimethoxysilane and then a nanowire layer/a graphene oxide layer were formed (d. S(NNH$_2$)/NW/GO). A contact pattern between silver nanowires varied depending on whether or not SAM layer was formed on the substrate and a kind of a functional group included in the formed SAM layer. When the SAM layer including N and a —NH$_2$ functional group was formed, a surface level was relatively uniform, lifting of a cross section was not observed, a clearer image was obtained, and the nanowire was sufficiently bonded. Meanwhile, when the SAM layer included only a —NH$_2$ functional group, a reaction between the graphene oxide and the substrate was not sufficient due to lack of hydrophilicity and it was observed that the silver nanowire was not completely bonded. Further, by comparison between the images c and d, it was observed that when the graphene oxide layer was present, a contact portion was lower in height. Thus, it could be seen that the contact portion was more sufficiently bonded due to an interaction between the graphene oxide and the SAM.

Figure 14:
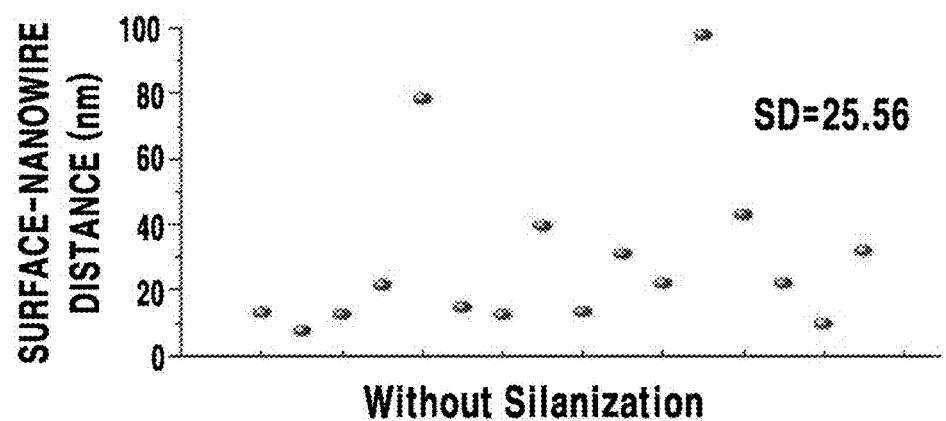
FIG. 14 provides graphs showing degrees of dispersion at a surface level of a transparent electrode according to an Example of the present disclosure.
Figure 14:
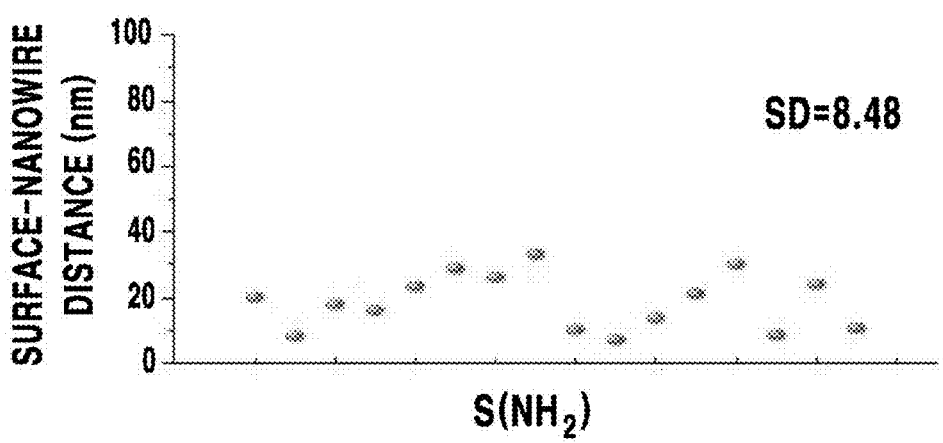
Figure 14:
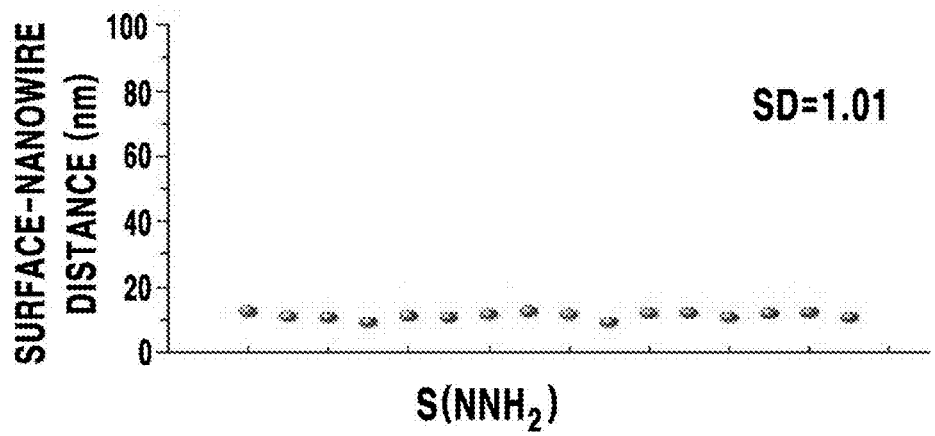

In this regard, FIG. 14 provides graphs showing degrees of dispersion at a surface level of transparent electrodes according to the present Example, and showing degrees of dispersion by measuring heights of nanowires at 16 points of each sample. Referring to FIG. 14, when only a nanowire layer was formed on a PDMS substrate without SAM (a), it was observed that a nanowire was not sufficiently bonded and a degree of dispersion was very high. Meanwhile, when SAM_NH$_2$/silver nanowire layer/graphene oxide layer were formed (b) and when SAM_N—NH$_2$/silver nanowire layer/graphene oxide layer were formed (c), it was observed that degrees of dispersion were relatively low. Particularly, when the SAM_N—NH$_2$ was formed, it was observed that the nanowire was very uniformly and sufficiently bonded to the surface with an almost linear distribution.

8. Measurement of Sheet Resistance of Manufactured Transparent Electrode

Figure 15:
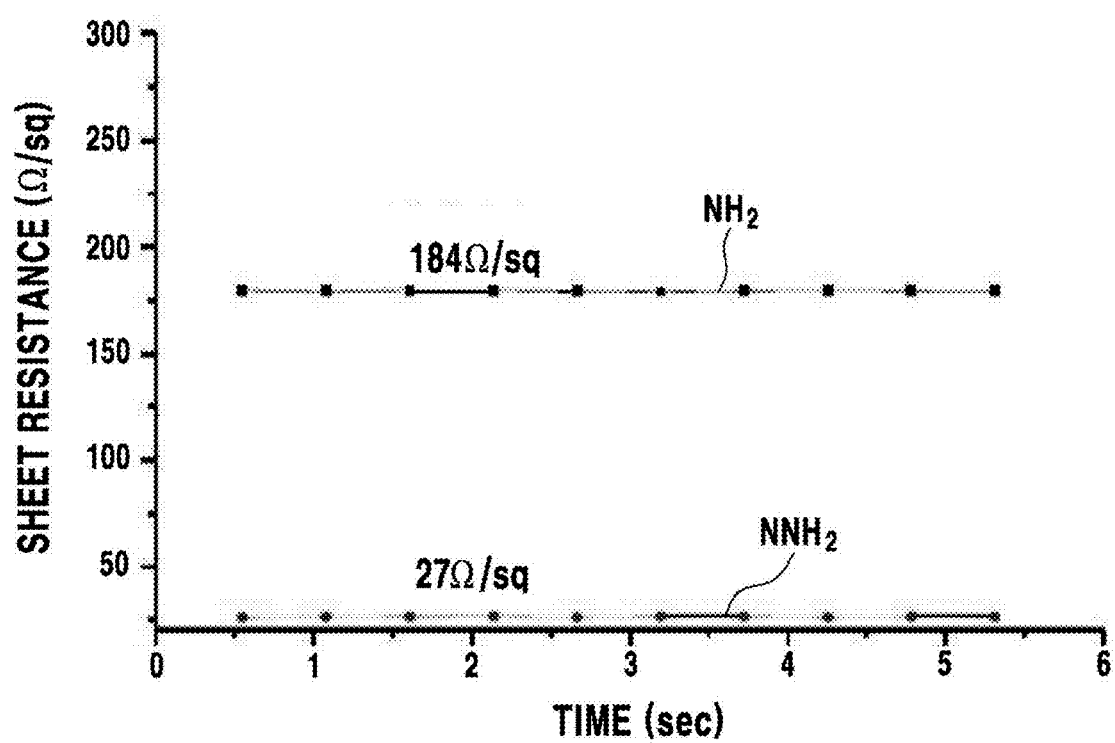
FIG. 15 is a graph obtained by measuring sheet resistances of a transparent electrode according to an Example of the present disclosure.

In the present Example, a resistance of the manufactured transparent electrode was measured by using a semiconductor parameter analyzer (Keithley 4200 semiconductor characterisation system). FIG. 15 is a graph obtained by measuring sheet resistances of transparent electrodes according to the present Example. The transparent electrodes were manufactured by forming the SAM_NH$_2$ and the SAM_N—NH$_2$ on a PDMS substrate and forming a silver nanowire layer and a graphene oxide layer in the same amount by the same method, and a resistance of the manufactured transparent electrodes was measured. In the case of the SAM_N—NH$_2$, a resistance value measured was as very low as about 27 Ω/sq, and in the case of the SAM_NH$_2$, a resistance value measured was as high as about 180 Ω/sq. From this result, it was confirmed that a surface of the SAM_N—NH$_2$ was more effectively bonded to the silver nanowire layer and the graphene oxide layer, so that a network was well maintained and a resistance value was low.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

INDUSTRIAL APPLICABILITY

The flexible transparent electrode and the method for manufacturing the same according to the present disclosure can be usefully used for flexible information electronic devices represented by a flexible display, a flexible transistor, a flexible touch panel, and a flexible solar cell.

We claim:

1. A transparent electrode comprising:
   a hydrophobic transparent substrate;
   a self-assembled monolayer comprising an amine group and disposed on the hydrophobic transparent substrate;
   a hydrophilic metal nanowire layer disposed on the self-assembled monolayer;
   a graphene oxide layer electrostatically bonded to the self-assembled monolayer, or electrostatically bonded to the self-assembled monolayer and the hydrophilic metal nanowire layer; and
   a hard coating layer disposed on the graphene oxide layer including a member selected from the group consisting of poly(ethylene glycol) diacrylate (PEGDA), PEDOT:PSS [poly(3,4-ethylenedioxythiophene) poly(styrenesulfonate)], TiO$_2$/PEDOT:PSS, Polytetrafluoroethylene (PTFE), a silver nanowire/polymer complex, and combinations thereof.

2. The transparent electrode of claim 1,
   wherein the self-assembled monolayer comprises an organic compound represented by the following Chemical Formula 1:

X-A-Y           Chemical Formula 1 wherein in the formula,
   X includes a member selected from the group consisting of a silane group, an alkylamine group, and a phosphonate group,
   Y is the amine group, and
   A as a carbon molecular axis comprises a member selected from the group consisting of:
   oxygen, nitrogen, phosphorus, sulfur, silicon, or germanium;
   an unsaturated hydrocarbon group comprising C≡C, C=O, C≡C—C≡C, C=C—C=C, or C=C—C=C;
   N=N, —NH—CO— or a benzene ring-containing functional group; and
   combinations thereof.

3. The transparent electrode of claim 1,
   wherein a thickness of the self-assembled monolayer is in a range from 1 nm to 100 nm.

4. The transparent electrode of claim 1,
   wherein the hydrophilic metal nanowire layer comprises a metal-nanowire or alloy-nanowire comprising a member selected from the group consisting of Ni, Co, Fe, Pt, Au, Ag, Al, Cr, Cu, Mg, Mn, Mo, Rh, Si, Ta, Ti, W, U, V, Zr, Ge, and combinations thereof.

5. The transparent electrode of claim 1, wherein a thickness of the hydrophilic metal nanowire layer is in a range from 10 nm to 1,000 nm.

6. The transparent electrode of claim 1, wherein the hydrophobic transparent substrate comprises a member selected from the group consisting of TAC (triacetylcellulose), PMMA (polymethyl methacrylate), PVA (polyvinyl alcohol), PC (polycarbonate), PE (polyethylene), PP (polypropylene), PS (polystyrene), PES (polyethersulfone), PEN (polyethylenenaphthalate), PI (polyimide), PDMS (polydimethylsiloxane), PET (polyethylene terephthalate), PAN (polyacrylonitrile), glass, and combinations thereof.

7. The transparent electrode of claim 1, wherein a thickness of the graphene oxide layer is in a range from 0.1 nm to 10 nm.

8. The transparent electrode of claim 1, wherein a part or all of the hydrophobic transparent substrate is treated with plasma.

9. The transparent electrode of claim 8, wherein the self-assembled monolayer is disposed on the plasma-treated surface of the hydrophobic transparent substrate.

10. A method for manufacturing the transparent electrode of claim 1, comprising:
providing the hydrophobic transparent substrate; forming the self-assembled monolayer comprising the amine group on the hydrophobic transparent substrate; forming the hydrophilic metal nanowire layer disposed on the self-assembled monolayer; forming the graphene oxide layer electrostatically bonded to the self-assembled monolayer, or electrostatically bonded to the self-assembled monolayer and the hydrophilic metal nanowire layer; and forming the hard coating layer on the graphene oxide layer including the member selected from the group consisting of poly(ethylene glycol) diacrylate (PEGDA), PEDOT:PSS [poly(3,4-ethylenedioxythiophene) poly(styrenesulfonate)], $TiO_2$/PEDOT:PSS, Polytetrafluoroethylene (PTFE), a silver nanowire/polymer complex, and combinations thereof.

11. The method of claim 10, wherein the self-assembled monolayer comprising the amine group on the hydrophobic transparent substrate comprises treating the hydrophobic transparent substrate with an organic compound represented by the following Chemical Formula 1:

X-A-Y    [Chemical Formula 1]

wherein in the formula,
X includes a member selected from the group consisting of a silane group, an alkylamine group, and a phosphonate group,
Y is the amine group,
A as a carbon molecular axis and includes a member selected from the group consisting of oxygen, nitrogen, phosphorus, sulfur, silicon, or germanium atom; an unsaturated hydrocarbon group including C≡C, C=C, C≡C—C≡C, C≡C—C=C, or C=C—C=C; N=N, —NH—CO— or a benzene ring-containing functional group; and combinations thereof.

12. The method of claim 10, wherein the hydrophilic metal nanowire layer on the self-assembled monolayer comprises treating the self-assembled monolayer with a metal-nanowire or alloy-nanowire including a member selected from the group consisting of Ni, Co, Fe, Pt, Au, Ag, Al, Cr, Cu, Mg, Mn, Mo, Rh, Si, Ta, Ti, W, U, V, Zr, Ge, and combinations thereof.

13. The method of claim 10, further comprising:
treating with a plasma on a part or all of the hydrophobic transparent substrate prior to forming the self-assembled monolayer comprising the amine group on the hydrophobic transparent substrate.

* * * * *